US010263113B2

(12) United States Patent
Chang et al.

(10) Patent No.: US 10,263,113 B2
(45) Date of Patent: *Apr. 16, 2019

(54) SEMICONDUCTOR DEVICE AND METHOD

(71) Applicant: Taiwan Semiconductor Manufacturing Company, Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/896,561

(22) Filed: Feb. 14, 2018

(65) Prior Publication Data
US 2018/0175203 A1 Jun. 21, 2018

Related U.S. Application Data

(63) Continuation of application No. 15/410,071, filed on Jan. 19, 2017, now Pat. No. 9,929,271.
(Continued)

(51) Int. Cl.
*H01L 29/78* (2006.01)
*H01L 21/28* (2006.01)
(Continued)

(52) U.S. Cl.
CPC .... *H01L 29/7851* (2013.01); *H01L 21/28008* (2013.01); *H01L 21/3065* (2013.01);
(Continued)

(58) Field of Classification Search
CPC .................................................. H01L 29/7851
See application file for complete search history.

(56) References Cited

U.S. PATENT DOCUMENTS 6,281,532 B1   8/2001  Doyle et al.
7,550,773 B2   6/2009  Booth, Jr. et al.
(Continued)

FOREIGN PATENT DOCUMENTS

KR   20140005777 A   1/2014
KR   20140119201 A   10/2014
(Continued)

*Primary Examiner* — William Coleman
(74) *Attorney, Agent, or Firm* — Slater Matsil, LLP

(57) ABSTRACT

A representative method for manufacturing a semiconductor device (e.g., a fin field-effect transistor) includes the steps of forming a gate structure having a first lateral width, and forming a first via opening over the gate structure. The first via opening has a lowermost portion that exposes an uppermost surface of the gate structure. The lowermost portion of the first via opening has a second lateral width. A ratio of the second lateral width to the first lateral width is less than about 1.1. A source/drain (S/D) region is disposed laterally adjacent the gate structure. A contact feature is disposed over the S/D region. A second via opening extends to and exposes an uppermost surface of the contact feature. A bottommost portion of the second via opening is disposed above a topmost portion of the gate structure.

20 Claims, 21 Drawing Sheets

Related U.S. Application Data

(60) Provisional application No. 62/370,581, filed on Aug. 3, 2016, provisional application No. 62/405,743, filed on Oct. 7, 2016.

(51) Int. Cl.

| | | |
|---|---|---|
| *H01L 21/3065* | (2006.01) | |
| *H01L 21/308* | (2006.01) | |
| *H01L 21/762* | (2006.01) | |
| *H01L 21/768* | (2006.01) | |
| *H01L 23/535* | (2006.01) | |
| *H01L 29/423* | (2006.01) | |
| *H01L 29/49* | (2006.01) | |
| *H01L 29/66* | (2006.01) | |

(52) U.S. Cl.
CPC .... *H01L 21/3081* (2013.01); *H01L 21/76224* (2013.01); *H01L 21/76802* (2013.01); *H01L 21/76877* (2013.01); *H01L 23/535* (2013.01); *H01L 29/42376* (2013.01); *H01L 29/4991* (2013.01); *H01L 29/66795* (2013.01); *H01L 29/785* (2013.01)

(56) References Cited

U.S. PATENT DOCUMENTS

| | | | |
|---|---|---|---|
| 7,667,271 | B2 | 2/2010 | Yu et al. |
| 7,910,453 | B2 | 3/2011 | Xu et al. |
| 8,048,790 | B2 | 11/2011 | Soss et al. |
| 8,329,546 | B2 | 12/2012 | Lee et al. |
| 8,377,779 | B1 | 2/2013 | Wang |
| 8,399,931 | B2 | 3/2013 | Liaw et al. |
| 8,426,300 | B2 | 4/2013 | Ramachandran et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,012,999 | B2 | 4/2015 | Liu et al. |
| 9,029,920 | B2 | 5/2015 | Xie et al. |
| 9,105,490 | B2 | 8/2015 | Wang et al. |
| 9,257,348 | B2 | 2/2016 | Xie et al. |
| 9,344,200 | B2 | 5/2016 | Cheng et al. |
| 9,379,221 | B1 | 6/2016 | He et al. |
| 9,478,623 | B2 | 10/2016 | Lim et al. |
| 9,698,232 | B2 | 7/2017 | Yang et al. |
| 9,929,271 | B2 * | 3/2018 | Chang ............... H01L 21/28008 |
| 2010/0133614 | A1 | 6/2010 | Beyer et al. |
| 2014/0001574 | A1 | 1/2014 | Chen et al. |
| 2014/0110755 | A1 | 4/2014 | Colinge |
| 2014/0151812 | A1 | 6/2014 | Liaw |
| 2014/0151817 | A1 | 6/2014 | Bohr et al. |
| 2015/0021672 | A1 | 1/2015 | Chuang et al. |
| 2015/0118836 | A1 | 4/2015 | Lin et al. |
| 2015/0228793 | A1 | 8/2015 | Chen et al. |
| 2015/0380305 | A1 | 12/2015 | Basker et al. |
| 2016/0141179 | A1 | 5/2016 | Wu et al. |
| 2016/0204221 | A1 | 7/2016 | He et al. |
| 2017/0069757 | A1 | 3/2017 | Peng et al. |

FOREIGN PATENT DOCUMENTS

| | | |
|---|---|---|
| KR | 20150093583 A | 8/2015 |
| KR | 20160059397 A | 5/2016 |

\* cited by examiner

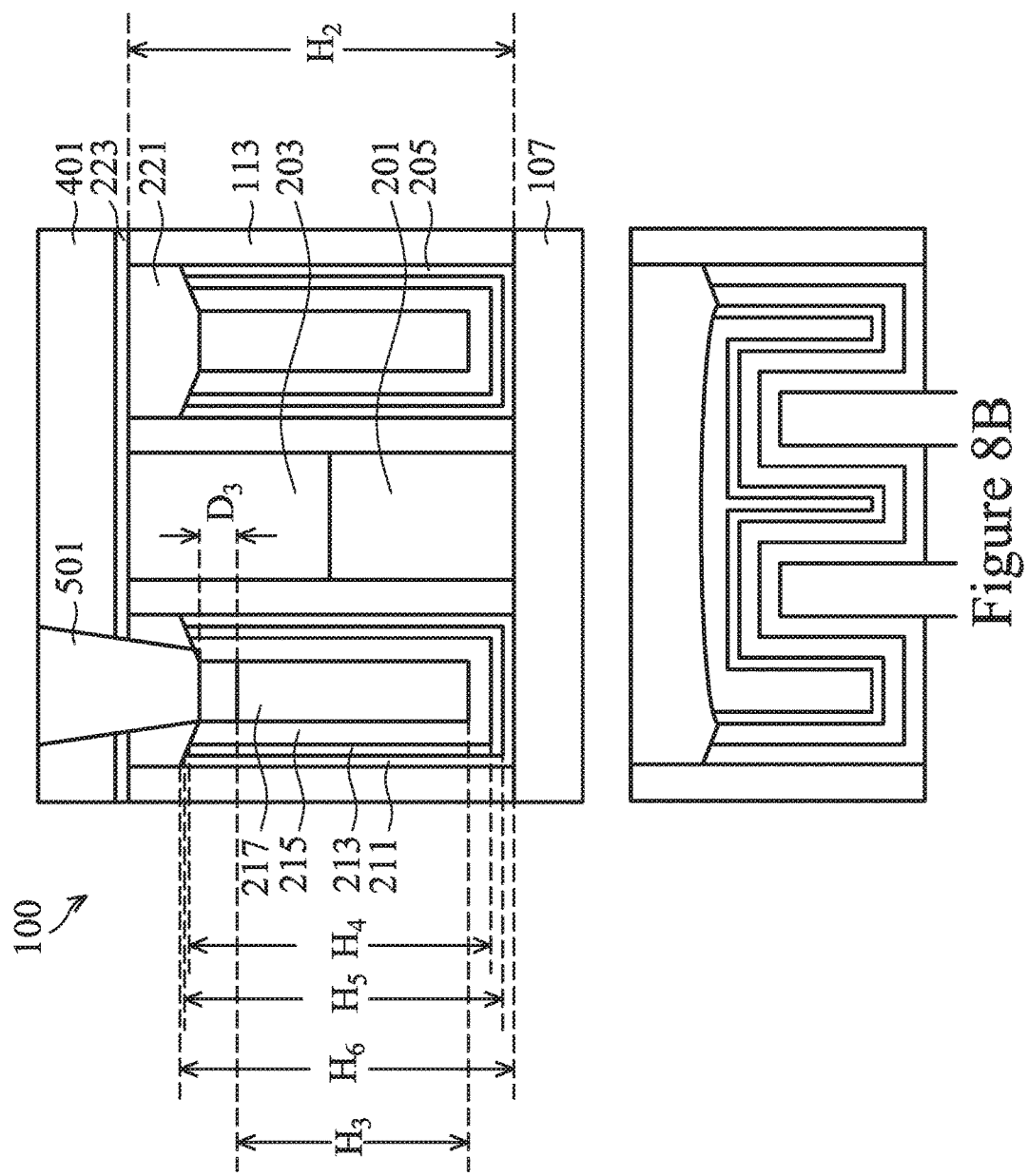

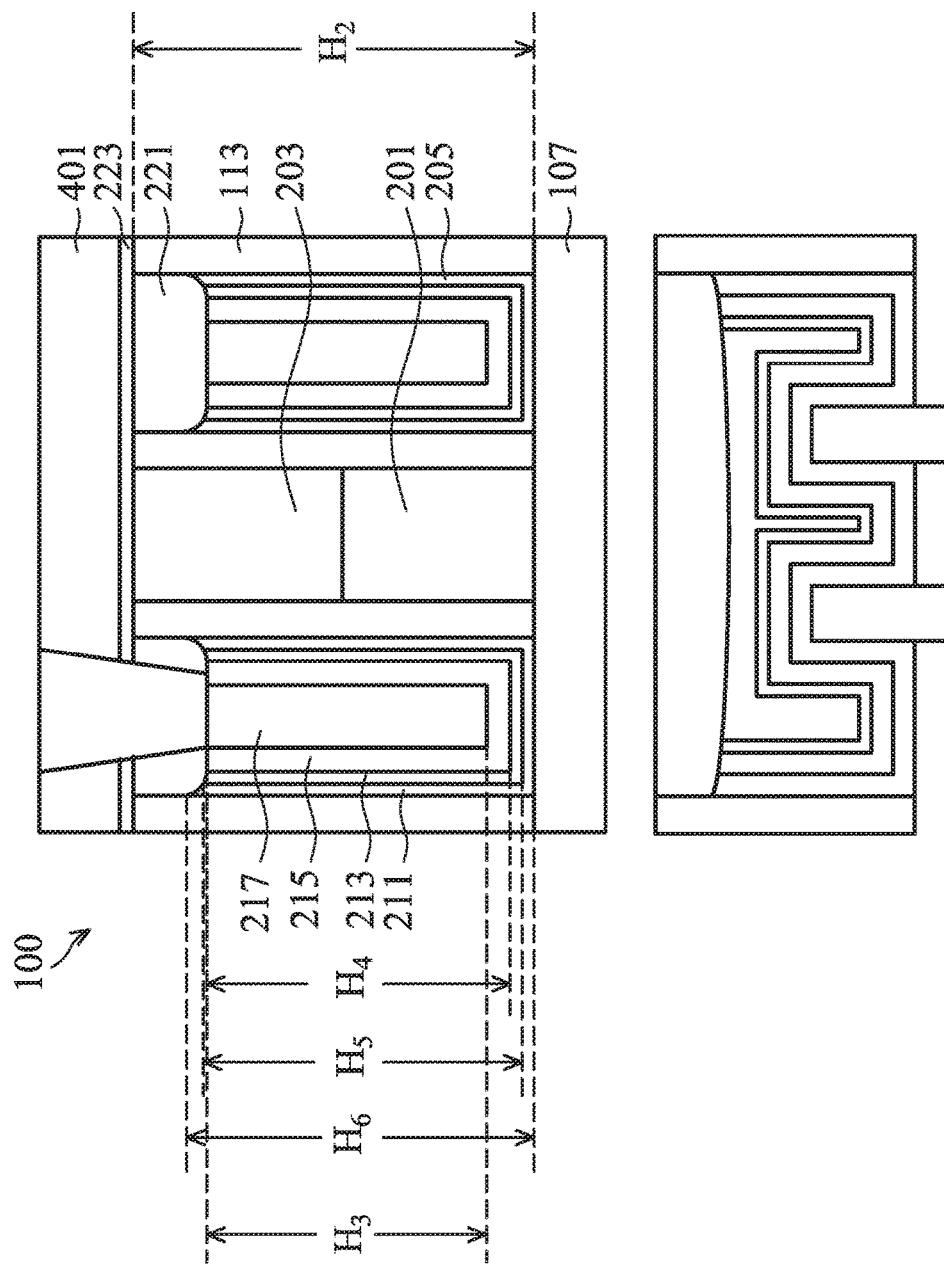

SEMICONDUCTOR DEVICE AND METHOD

PRIORITY

This application is a continuation of U.S. application Ser. No. 15/410,071, filed on Jan. 19, 2017, entitled "Semiconductor Device and Method," which claims priority to and the benefit of U.S. Provisional Application No. 62/370,581, filed on Aug. 3, 2016, entitled "Gate Contact Structure and Method of Forming Same," and U.S. Provisional Application No. 62/405,743, filed on Oct. 7, 2016, entitled "Semiconductor Device and Method," which applications are hereby incorporated herein by reference in their entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A-8D illustrate additional embodiments of the shape of the gate electrode in accordance with some embodiments.

DETAILED DESCRIPTION

Figure 1:
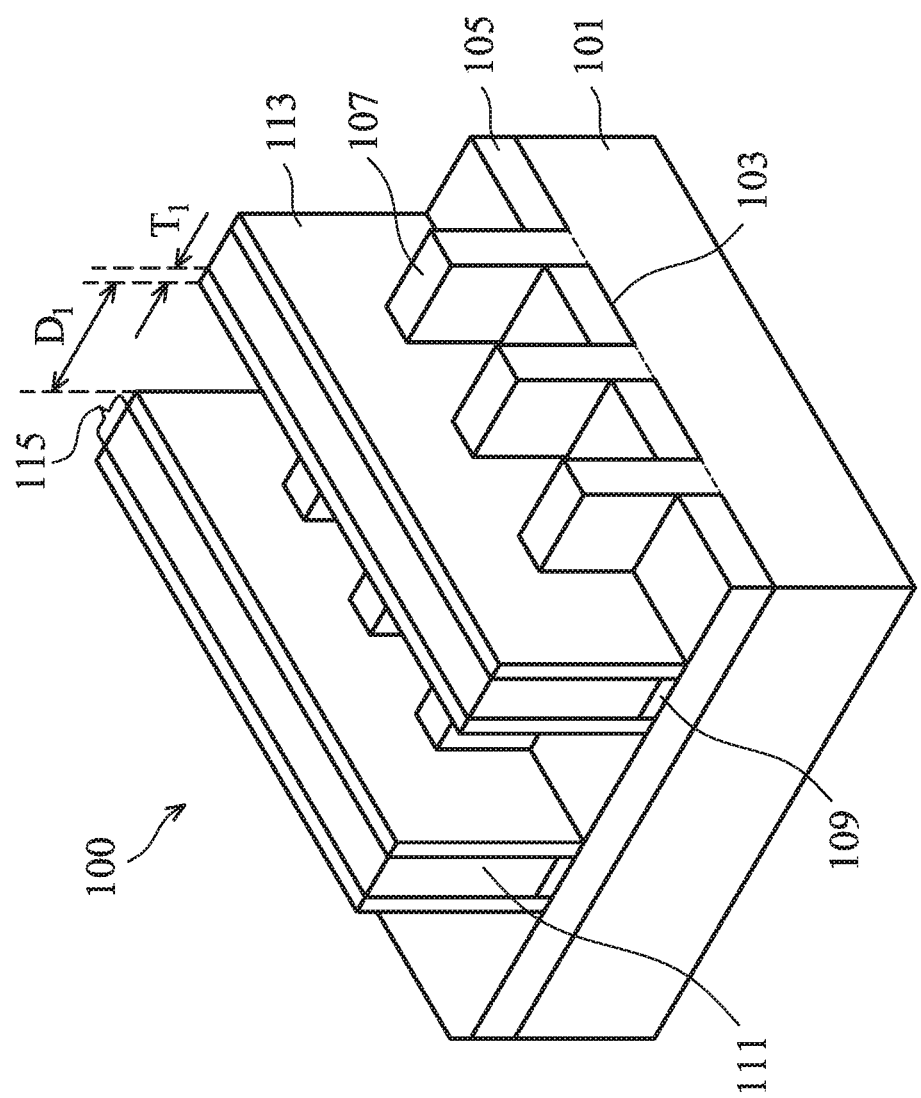
FIG. 1 illustrates steps in a process of forming a FinFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is illustrated a perspective view of a semiconductor device 100 such as a FinFET device. In an embodiment the semiconductor device 100 comprises a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive material and may be selected from a group comprising of W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a first thickness $T_1$ of between about 5 Å and about 500 Å. Additionally, once the first spacers 113 have been formed, a first spacer 113 adjacent to one stack 115 may be separated from a first spacer 113 adjacent to another stack 115 by a first distance $D_1$ of between about 10 nm and about 1000 nm, such as about 20 nm. However, any suitable thicknesses and distances may be utilized.

Figure 2:
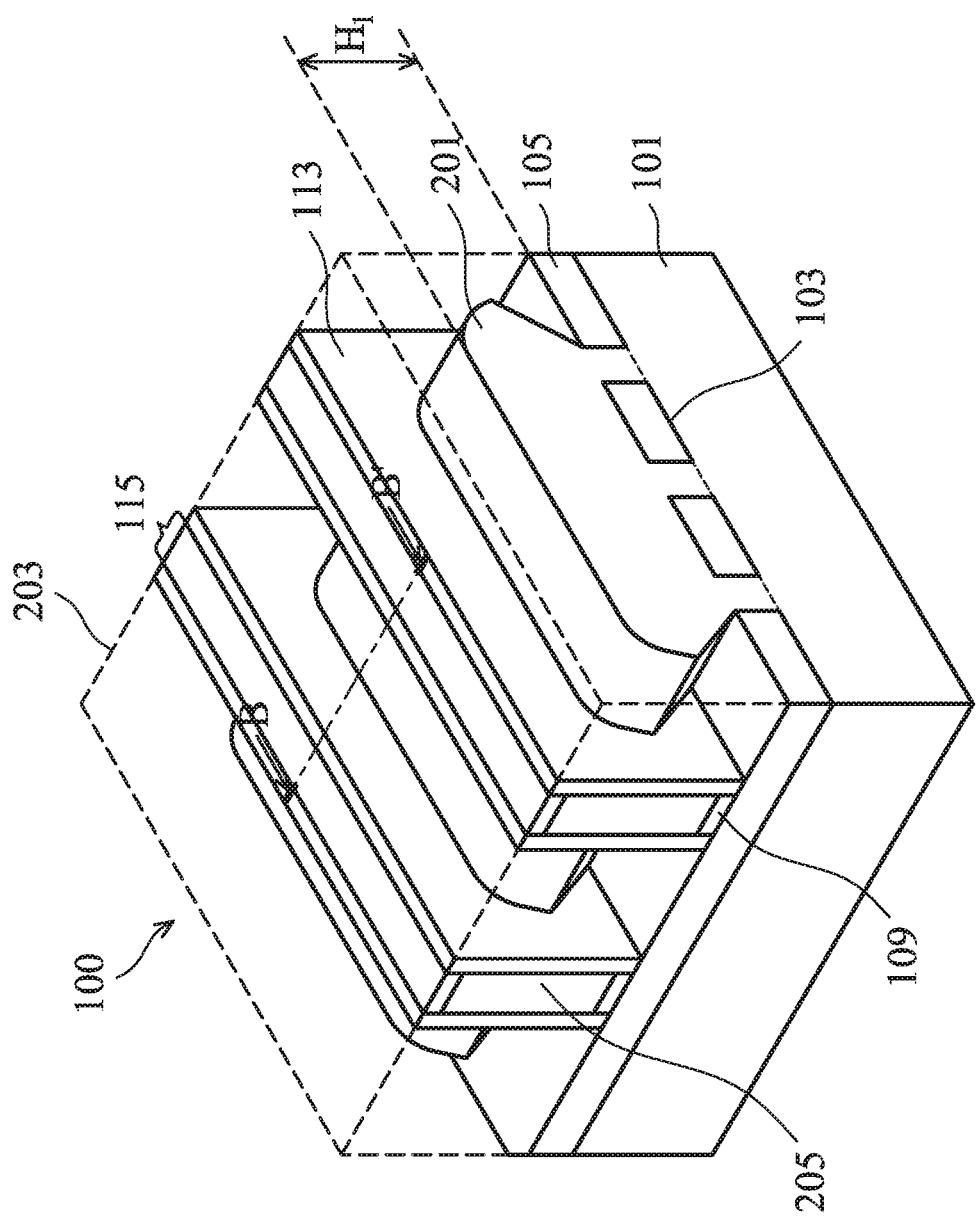
FIG. 2 illustrates formation of source/drain regions in accordance with some embodiments.
Figure 3:
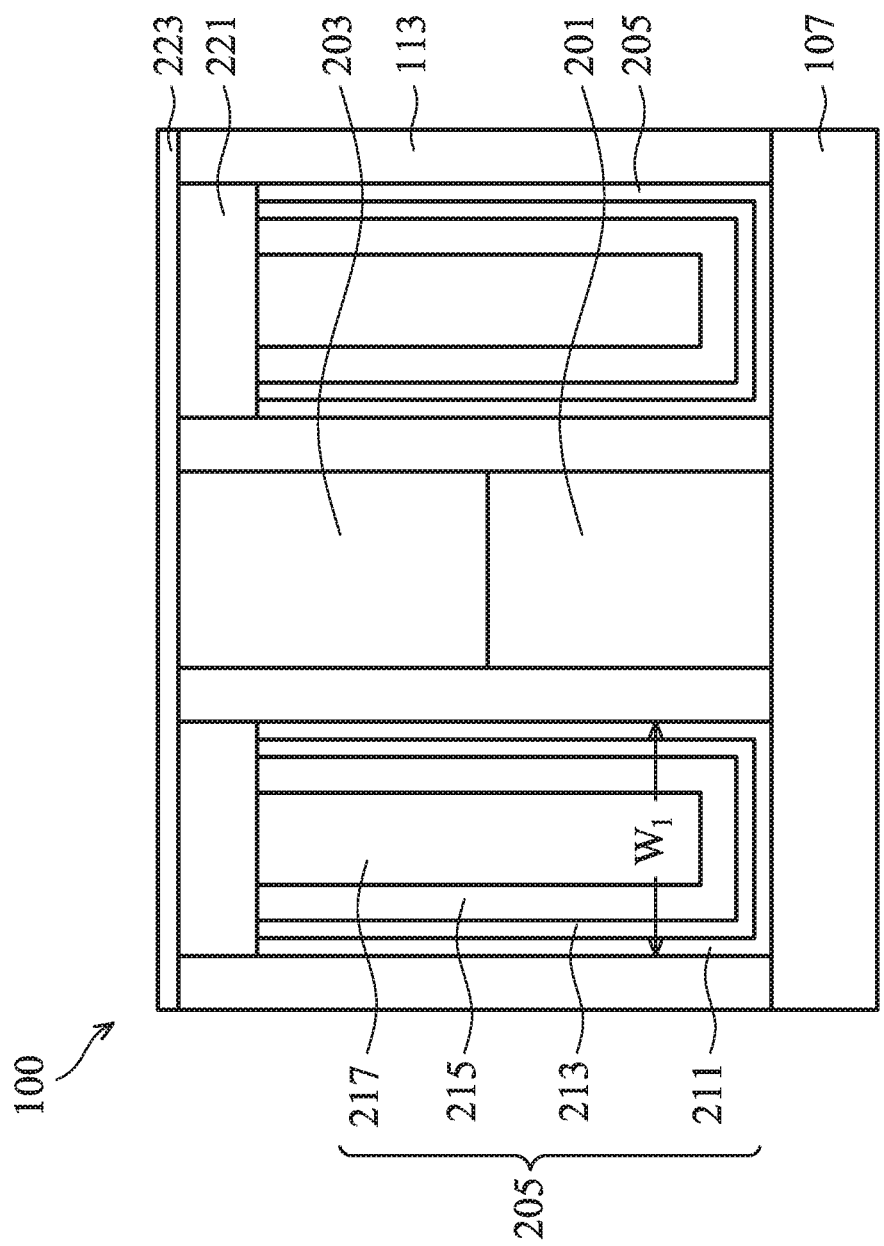
FIG. 3 illustrates a cross-section of FIG. 2 in accordance with some embodiments.

FIGS. 2-3 illustrate a removal of the fins 107 from those areas not protected by the stacks 115 and the first spacers 113 and a regrowth of source/drain regions 201 (with FIG. 3 illustrating a cross-sectional view of FIG. 2 along line B-B'). The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a first height $H_1$ over the first isolation regions 105 of between about 20 nm and about 100 nm, such as about 50 nm. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present invention to the steps presented above.

Additionally at this point the hard mask that covered the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

FIG. 2 also illustrates a formation of an inter-layer dielectric (ILD) layer 203 (illustrated in dashed lines in FIG. 2 in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness of between about 100 Å and about 3,000 Å. Once formed, the ILD layer 203 may be planarized with the spacers 113 using, e.g., a planarization process such as chemical mechanical polishing process, although any suitable process may be utilized.

After the formation of the ILD layer 203, the material of the dummy gate electrode 111 and the dummy gate dielectric 109 may be removed and replaced to form the gate stack 205. In an embodiment the dummy gate electrode 111 may be removed using, e.g., a wet or dry etching process that utilizes etchants that are selective to the material of the dummy gate electrode 111. However, any suitable removal process may be utilized.

Once the dummy gate electrode 111 has been removed, the openings left behind may be refilled to form the gate stack 205. In a particular embodiment the gate stack 205 comprises a first dielectric material 211, a first metal material 213, a second metal material 215, and a third metal material 217. In an embodiment the first dielectric material 211 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material 211 may be deposited to a thickness of between about 5 Å and about 100 Å, although any suitable material and thickness may be utilized.

The first metal material 213 may be formed adjacent to the first dielectric material 211 and may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material 213 may be deposited using a deposition process such as atomic layer deposition, chemical vapor deposition, sputtering, or the like, to a thickness of between about 5 Å and about 200 Å, although any suitable deposition process or thickness may be used.

The second metal material 215 may be formed adjacent to the first metal material 213 and, in a particular embodiment, may be similar to the first metal material 213. For example, the second metal material 215 may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material 215 may be deposited using a deposition process such as atomic layer deposition, chemical vapor deposition, sputtering, or the like, to a thickness of between about 5 Å and about 200 Å, although any suitable deposition process or thickness may be used.

The third metal material 217 fills a remainder of the opening left behind by the removal of the dummy gate electrode 111. In an embodiment the third metal material 217 is a metallic material such as W, Al, Cu, AlCu, W, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the opening left behind by the removal of the dummy gate electrode 111. In a particular embodiment the third metal material 217 may be deposited to a thickness of between about 5 Å and about 500 Å, although any suitable material, deposition process, and thickness may be utilized.

Once the opening left behind by the removal of the dummy gate electrode 111 has been filled, the materials may be planarized in order to remove any material that is outside of the opening left behind by the removal of the dummy gate electrode 111. In a particular embodiment the removal may be performed using a planarization process such as chemical mechanical polishing. However, any suitable planarization and removal process may be utilized.

Additionally, after the gate stack 205 (and, as such, the gate width of the semiconductor device) has been formed, the gate stack 205 may have a first width $W_1$ of between about 10 nm and about 200 nm. However, any suitable width may be utilized.

After the materials of the gate stack 205 have been formed and planarized, the materials of the gate stack 205 may be recessed and capped with a capping layer 221. In an embodiment the materials of the gate stack 205 may be recessed using, e.g., a wet or dry etching process that utilizes etchants selective to the materials of the gate stack 205. However, any suitable process may be utilized.

Once the materials of the gate stack 205 have been recessed, the capping layer 221 may be deposited and planarized with the spacers 113. In an embodiment the capping layer 221 is a material such as SiN, SiON, SiCON, SiC, SiOC, combinations of these, or the like, deposited using a deposition process such as atomic layer deposition, chemical vapor deposition, sputtering, or the like. The capping layer 221 may be deposited to a thickness of between about 5 Å and about 200 Å, and then planarized using a planarization process such as chemical mechanical polishing such that the capping layer 221 is planar with the spacers 113.

FIGS. 2-3 additionally illustrate a formation of a first etch stop layer Z over the gate stack 205. In one embodiment, the first etch stop layer 223 may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and alternative techniques of forming the first etch stop layer 223, such as low pressure CVD (LP-CVD), PVD, or the like, could alternatively be used. The first etch stop layer 223 may have a thickness of between about 5 Å and about 500 Å.

Figure 4:
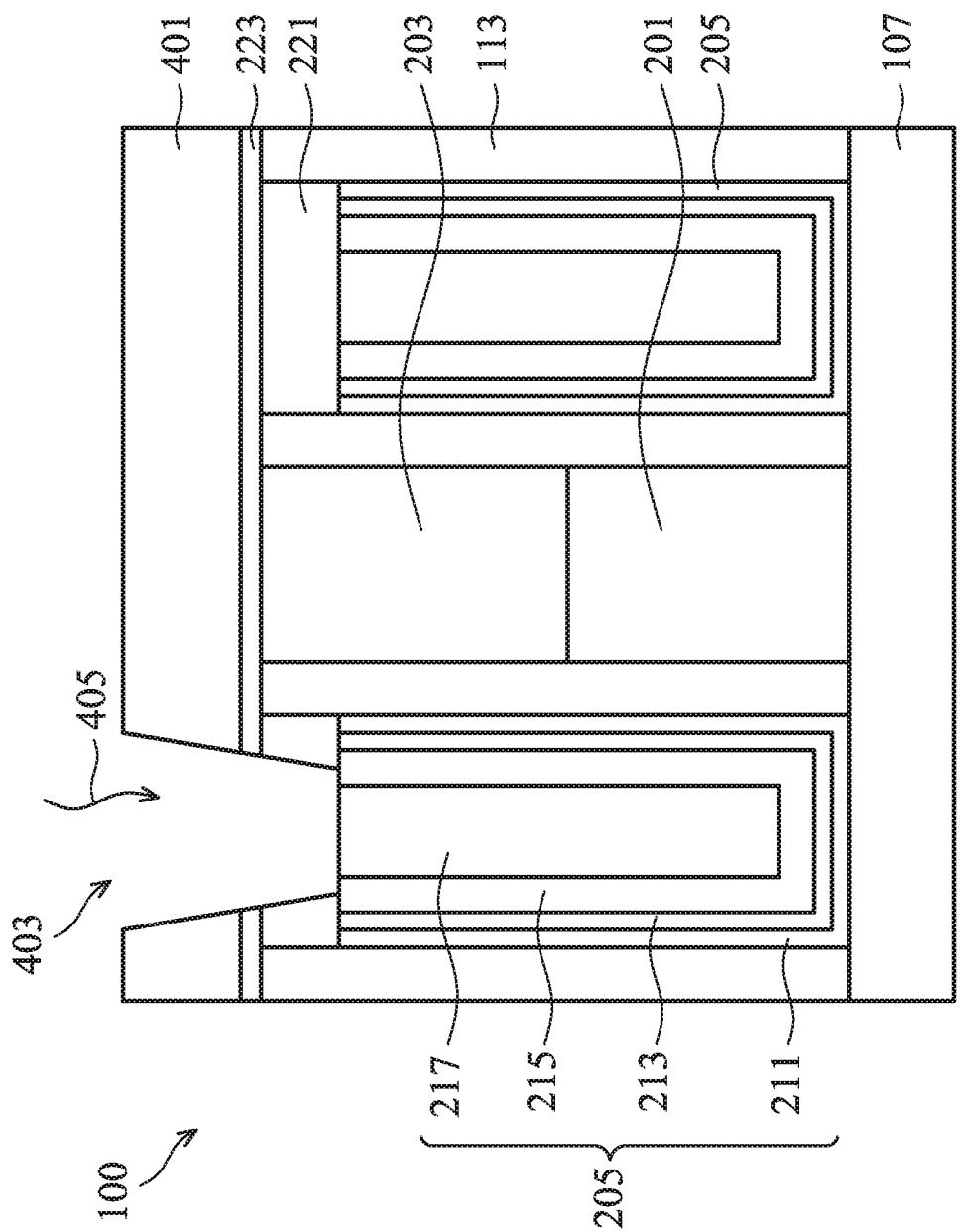
FIG. 4 illustrates a formation of an opening in accordance with some embodiments.

FIG. 4 illustrates a formation of a first dielectric layer 401 over the gate stacks 205 and a first opening 403 through the first dielectric layer 401 to expose the gate stack 205. In one embodiment, the first opening 403 may be formed through the first dielectric layer 401 and the first etch stop layer 223 to expose the underlying gate stack 205. In an embodiment the first opening 403 may be formed by initially placing and patterning a first photoresist (not separately illustrated) over the first etch stop layer 223. In an embodiment the first photoresist is a tri-layer photoresist, with a bottom anti-reflective coating (BARC) layer, an intermediate mask layer, and a top photoresist layer. However, any suitable type of photosensitive material or combination of materials may be utilized.

Once the first photoresist has been placed, the first photoresist is patterned. In an embodiment the first photoresist may be patterned by exposing a photosensitive material within the first photoresist (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the first photoresist are different from the physical properties of the unexposed portions of the first photoresist. The first photoresist may then be developed with, e.g., a developer (not separately illustrated), in order to separate the exposed portion of the first photoresist from the unexposed portion of the first photoresist.

Once the first photoresist has been patterned, the first opening 403 may be formed using the first photoresist as a mask. In an embodiment the first opening 403 may be formed using a first etching process (represented in FIG. 4 by the wavy line labeled 405), which may be one or more anisotropic etching processes such as reactive ion etch processes. However, any suitable process, such as a wet etching process, and any suitable reactants may be used.

The first etching process 405 may be utilized to form the first opening 403 in preparation for a formation of the first contact 501. In a particular embodiment the first etching process 405 using one or more etches may be utilized to remove the material of the first dielectric layer 401, the first etch stop layer 223, and the capping layer 221 to expose the gate stack 205.

Once the first opening 403 has been formed, the first photoresist may be removed. In an embodiment the first photoresist may be removed using, e.g., an ashing process, whereby a temperature of the first photoresist is increased until the first photoresist undergoes a thermal decomposition, at which point the first photoresist may be easily removed. However, any suitable removal process, such as a wet etch, may also be utilized.

Figure 5:
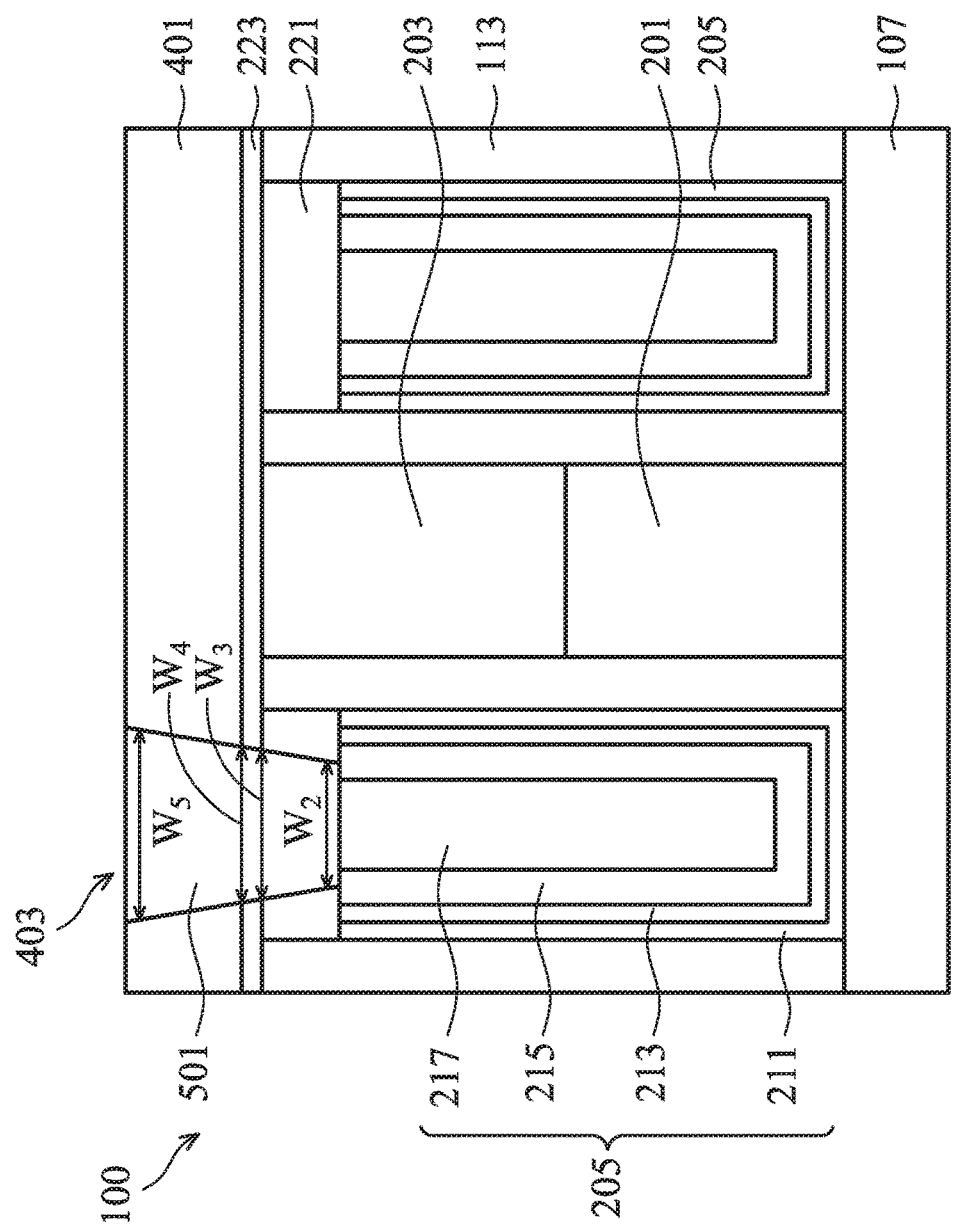
FIG. 5 illustrates a formation of a first contact to the gate electrode in accordance with some embodiments.

FIG. 5 illustrates a formation of the first contact 501 within the first opening 403 and in physical and electrical connection with the gate stack 205. In an embodiment the first contact 501 may be a conductive material such as Ti, W, TiAlN, TaC, TaCN, TaSiN, Mn, Zr, TiN, TaN, Ru, Mo, or WN, although any suitable material, such as aluminum, copper, alloys of these, combinations of these, or the like, and may be deposited into the first opening 403 using a deposition process such as sputtering, chemical vapor deposition, electroplating, electroless plating, or the like, to fill and/or overfill the first opening 403 formed by the first etching process 405. Once filled or overfilled, any deposited material outside of the first opening 403 formed by the first etching process 405 may be removed using a planarization process such as chemical mechanical polishing (CMP). However, any suitable material and process of formation may be utilized.

By using a series of one or more anisotropic etches, the first opening 403 may be formed to have slanted sidewalls which will cause the first opening 403 to have a varying width as it extends through the first dielectric layer 401, also causing the first contact 501 to have a varying width as it extends through the first etch stop layer 223, and the capping layer 221. In a particular embodiment the first contact 501 at a point adjacent to the gate stack 205 will have a second width $W_2$ of between about 3 nm to about 20 nm. Additionally, at a point adjacent to a bottom of the first etch stop layer 223, the first contact 501 will have a third width $W_3$ of between about 5 nm and about 20 nm and, at a point adjacent to a top of the first etch stop layer 223, the first contact 501 will have a fourth width $W_4$ of between about 10 nm and about 30 nm. Finally, at a top surface of the first contact 501 the first contact 501 may have a fifth width $W_5$ of between about 15 nm and about 50 nm.

Additionally, the second width $W_2$ is greater than the first width $W_1$, and has a ratio between the second width $W_2$ and the first width $W_1$ of less than at least 1.1, such as less than about 1.0. The fifth width $W_5$ is also greater than the fourth width $W_4$, and has a ratio between the fifth width $W_5$ and the fourth width $W_4$ of greater than at least 1, while the fourth width $W_4$ is larger than the third width $W_3$, and has a ratio between the fourth width $W_4$ and the third width $W_3$ that is greater than 1. Finally, the third width $W_3$ is greater than the second width $W_2$, such as by having a ration between the third width $W_3$ and the second width $W_2$ of greater than 1.

In a particular embodiment the first width $W_1$ is greater than the fifth width $W_5$, which is greater than the fourth width $W_4$, which is greater than the third width $W_3$, which is greater than the second width $W_2$. In another embodiment the fifth width $W_5$ is greater than the first width $W_1$, which is greater than the fourth width $W_4$, which is greater than the third width $W_3$, which is greater than the second width $W_2$. However, the second width $W_2$ is less than the first width $W_1$.

By utilizing the embodiments described herein, the critical dimensions of the first contact 501 may be reduced, thereby allowing for an enlarged process window and the resistance can be better tuned to be lower. Such improvements allow for an overall improvement in the manufacturing process as well as a benefit to the yield.

FIGS. 6A-6D illustrates additional embodiments in which the heights of the first dielectric material 211, the first metal material 213, the second metal material 215, and the third metal material 217 are tuned. In each of these embodiments the first spacers 113 have a second height $H_2$ of between about 10 nm and about 150 nm.

Figure 6A:
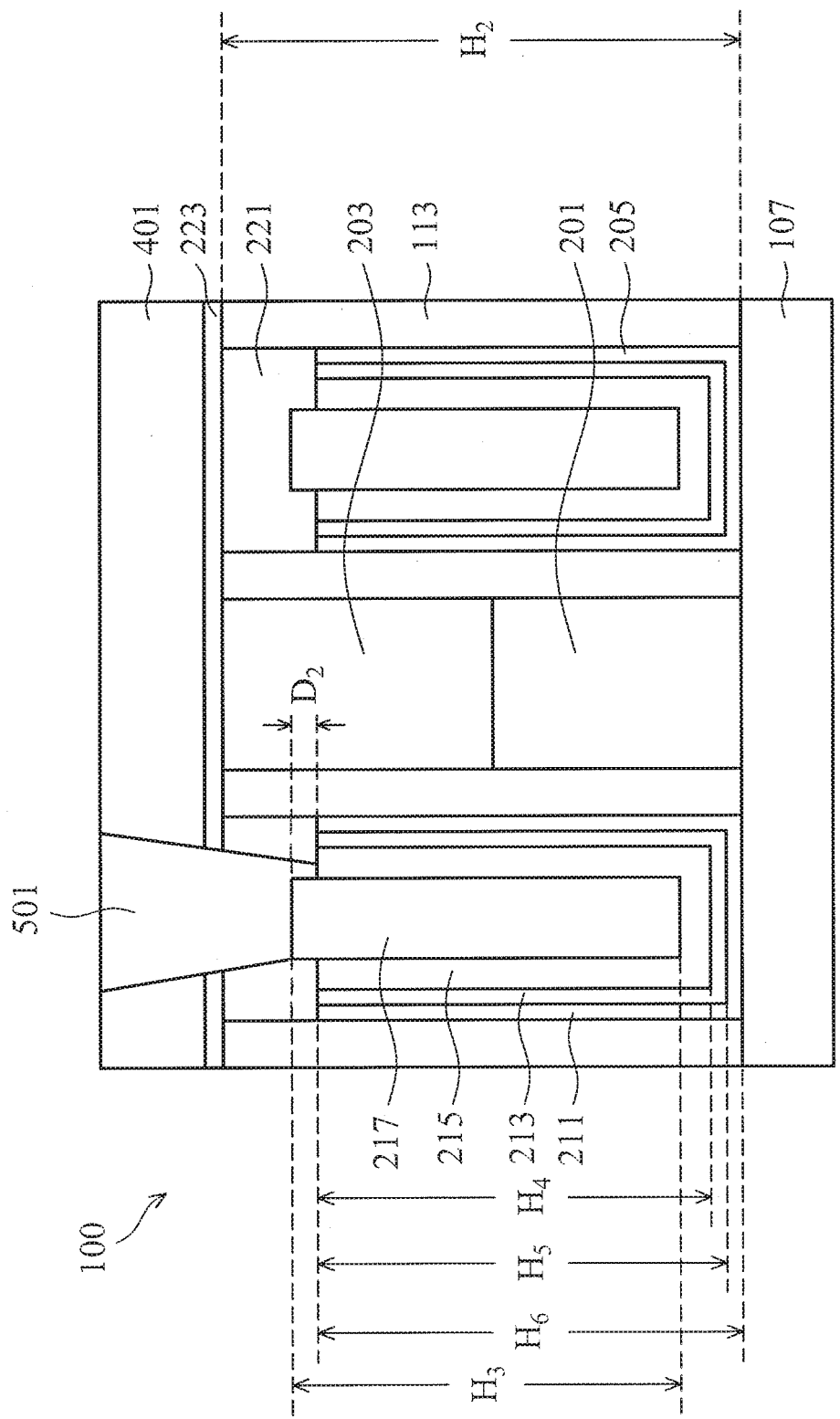
FIGS. 6A-6D illustrate different shapes of the gate electrode in accordance with some embodiments.

Looking first at the embodiment illustrated in FIG. 6A, the third metal material 217 may be formed to have a third height $H_3$ that is less than the second height $H_2$ and may be between about 5 nm to about 100 nm. Additionally, the second metal material 215 will have a fourth height $H_4$ of between about 5 and about 80 nm and the first metal material 213 will have a fifth height $H_5$ of between about 5 nm and about 80 nm. Finally, the first dielectric material 211 has a sixth height $H_6$ of between about 5 nm and about 90 nm. However, any suitable thicknesses may be utilized.

In this embodiment, the third height $H_3$ is greater than the fourth height $H_4$ and has a ratio of the third height $H_3$ to the fourth height $H_4$ of greater than 1. Additionally, the second height $H_2$ is larger than the third height $H_3$, and has a ratio of the second height $H_2$ to the third height $H_3$ of greater than 1. Finally, depending on the desired shape, a ratio of the sixth height $H_6$ to the first height $H_1$ may be larger than or smaller than 1.

However, in the embodiment illustrated in FIG. 6A, instead of the gate stack 205 having a fully planar top surface (as illustrated above with respect to FIGS. 1-5), the gate stack 205 has only a partially planar top surface. In particular to this embodiment, while the second metal material 215, the first metal material 213, and the first dielectric material 211 may be planar with each other, the third metal material 217 may extend upwards from the planar surface a second distance $D_2$ of between about 1 nm and about 20 nm, such as about 5 nm. However, any suitable distance may be utilized.

In order to obtain the partially planar top surface of the gate stack 205 (without the third metal material 217 being included in the planar top surface), the top surfaces of the second metal material 215, the first metal material 213, and the first dielectric material 211 may be recessed using a wet etching process with one or more etchants that are selective to the materials of the second metal material 215, the first metal material 213, and the first dielectric material 211. In a particular embodiment, the wet etching may be continued for a time of about 10 second in order to obtain the partially planar top surface of the gate stack 205. However, any suitable removal process and time may be utilized.

Figure 6B:
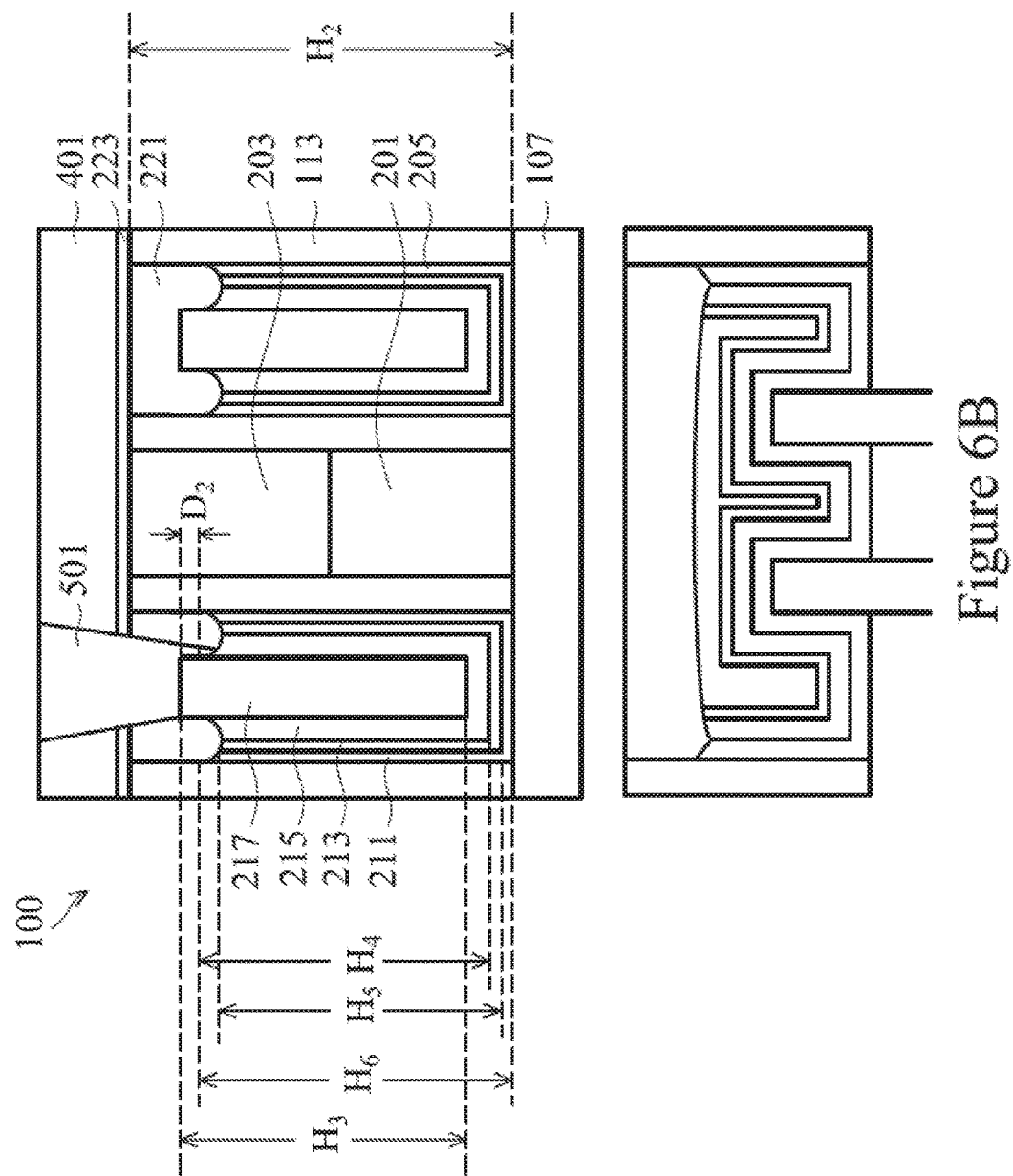

FIG. 6B illustrates another embodiment similar to the embodiment illustrated and discussed in FIG. 6A, but in which, instead of the second metal material 215, the first metal material 213, and the first dielectric material 211 being planar with each other, the fifth height $H_5$ of the first metal material 213 is recessed from the fourth height $H_4$ and the sixth height $H_6$ of the second metal material 215 and the first dielectric material 211, respectively, to form a "W" shape.

In this embodiment, a wet etch similar to the wet etch that was described above with respect to FIG. 6A may be utilized. However, in this embodiment to obtain the recessed layers the wet etch may be continued to overetch the materials of the second metal material 215, the first metal material 213, and the first dielectric material 211 beyond the planar surface illustrated in FIG. 6A. For example, in a particular embodiment, a similar wet etch is utilized but the etching time is extended by 10% in order to overetch the materials. In an embodiment in which a 10 second etch obtains the planar shape, the overetch to obtain the "W" shape may be performed for 11 seconds. However, any suitable removal process and time may be utilized.

Figure 6C:
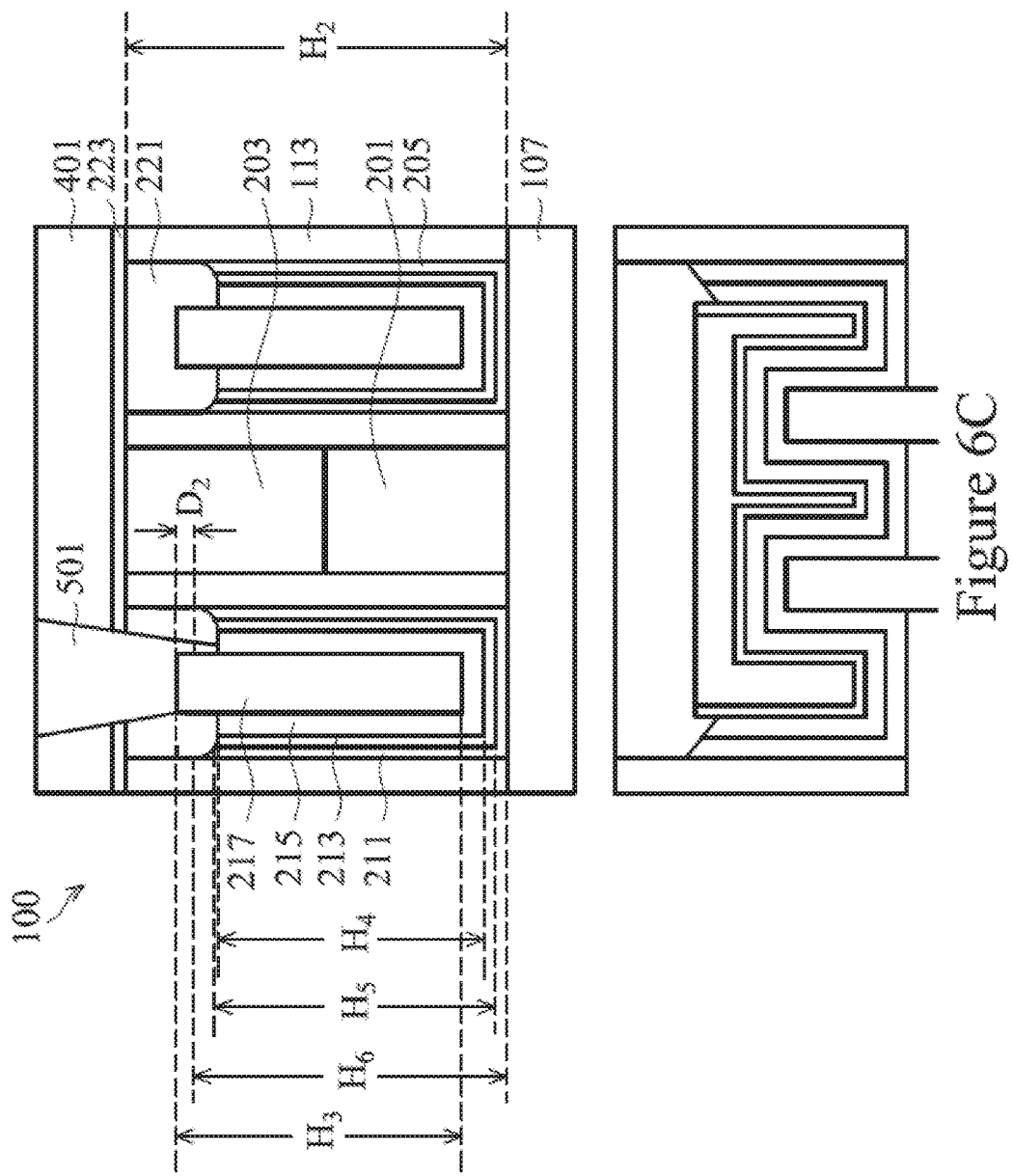

FIG. 6C illustrates yet another embodiment similar to the embodiment illustrated and discussed above with respect to FIG. 6A, but in which, instead of the second metal material 215, the first metal material 213, and the first dielectric material 211 being planar with each other, the fourth height $H_4$ of the second metal material 211 is less than the fifth height $H_5$ of the first metal material 213, and the fifth height $H_5$ of the first metal material 213 is less than the sixth height $H_6$ of the first dielectric material 211.

In this embodiment, a wet etch similar to the wet etch that was described above with respect to FIG. 6A may be utilized. However, in this embodiment to obtain the recessed layers in a concave shape, the wet etch may be continued to overetch the materials of the second metal material 215, the first metal material 213, and the first dielectric material 211 beyond the planar surface illustrated in FIG. 6A and beyond the "W" shape illustrated in FIG. 6B. For example, in a particular embodiment, a similar wet etch is utilized but the etching time is extended by 20% in order to overetch the materials. In an embodiment in which a 10 second etch obtains the planar shape, the overetch to obtain the "W" shape may be performed for 12 seconds. However, any suitable removal process and time may be utilized.

Figure 6D:
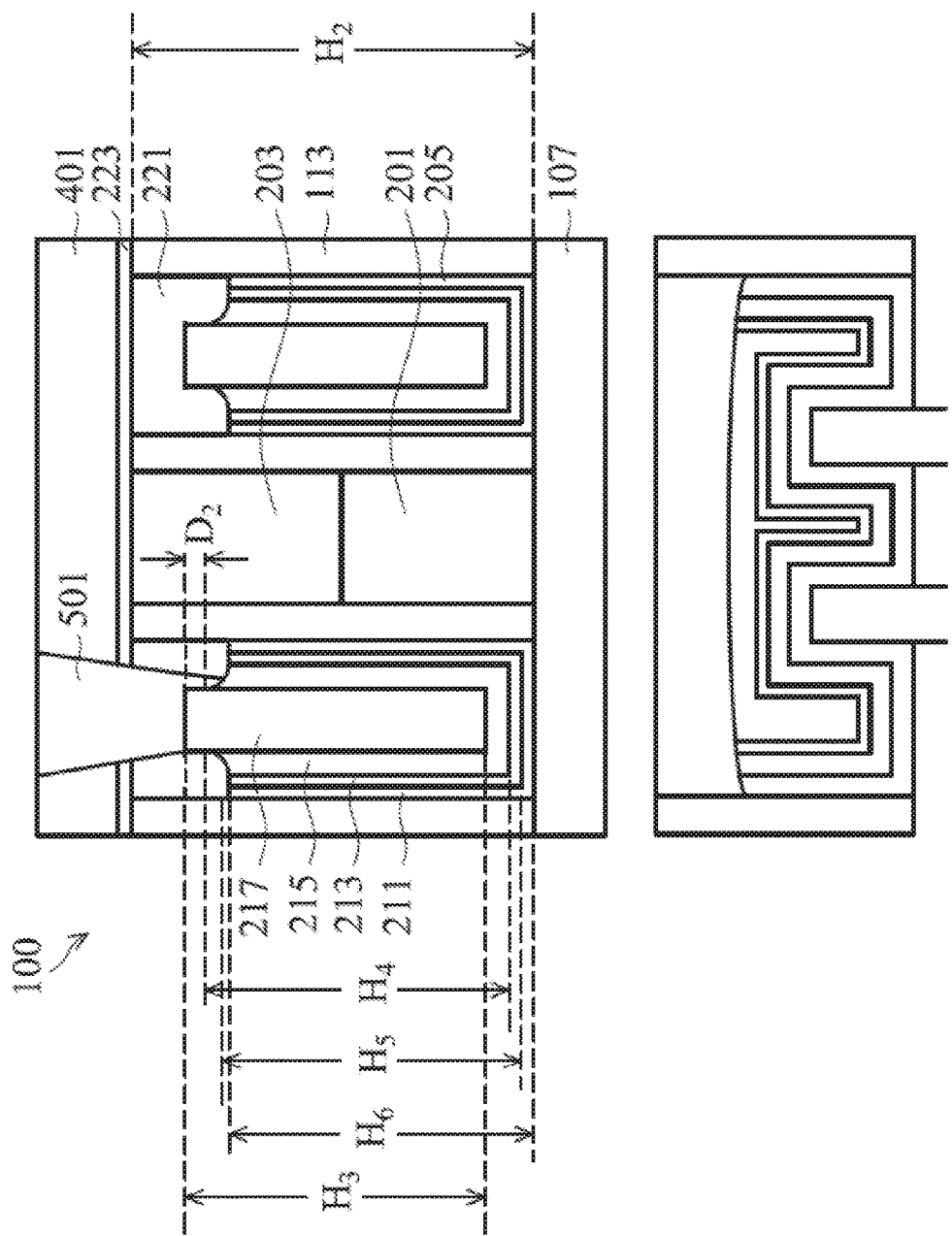
Figure 7A:
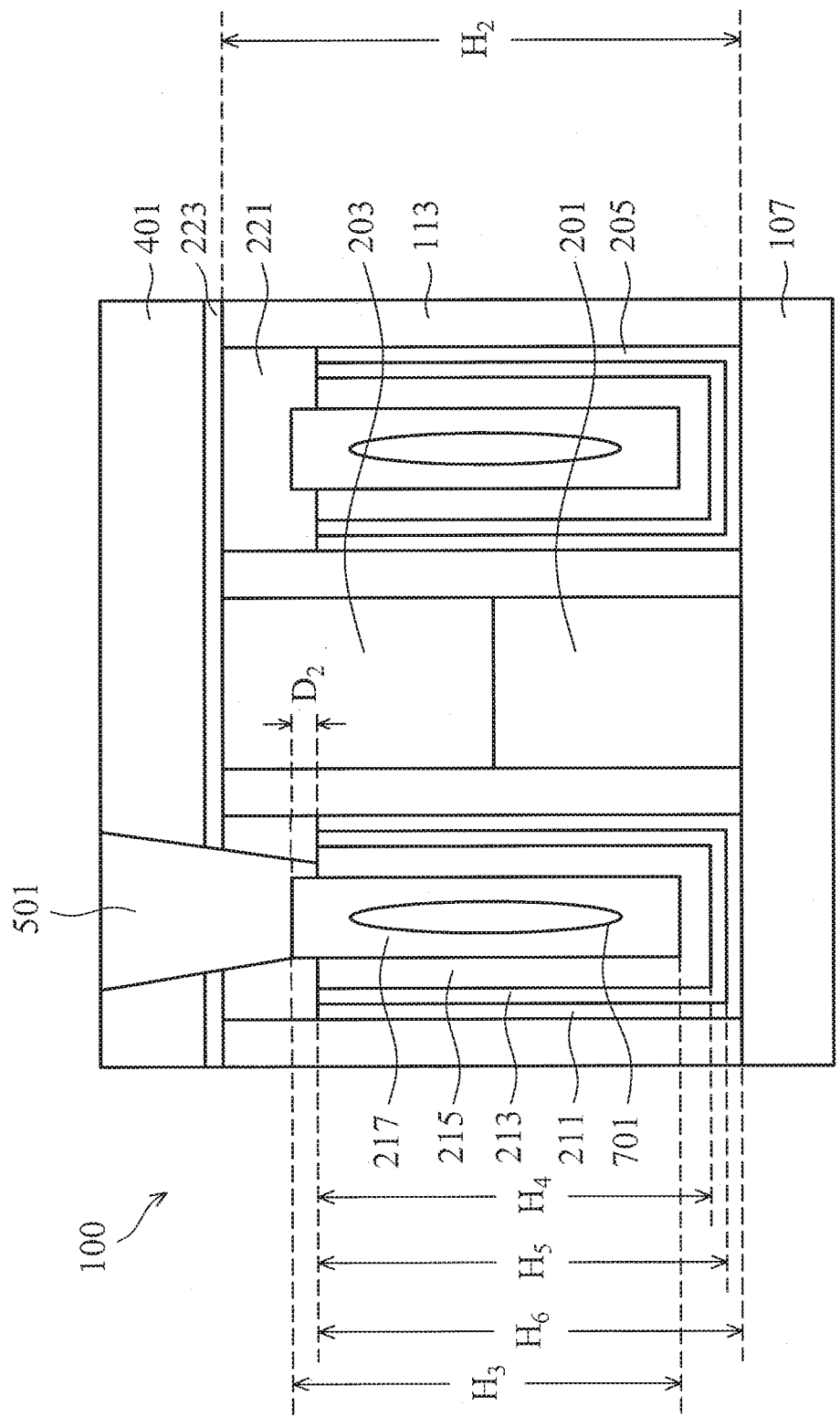
FIGS. 7A-7D illustrate a formation of a seam in accordance with some embodiments.
Figure 7B:
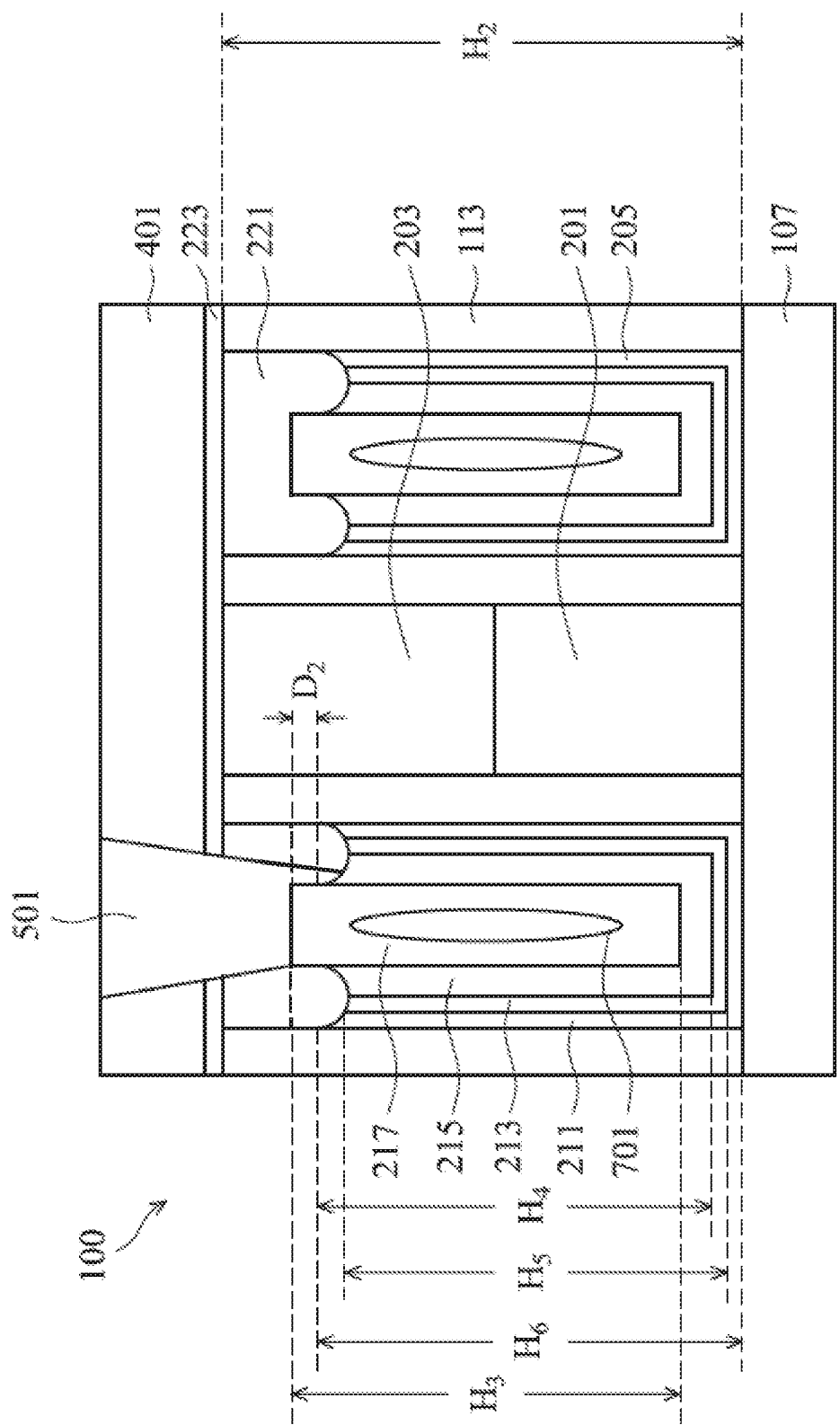
Figure 7C:
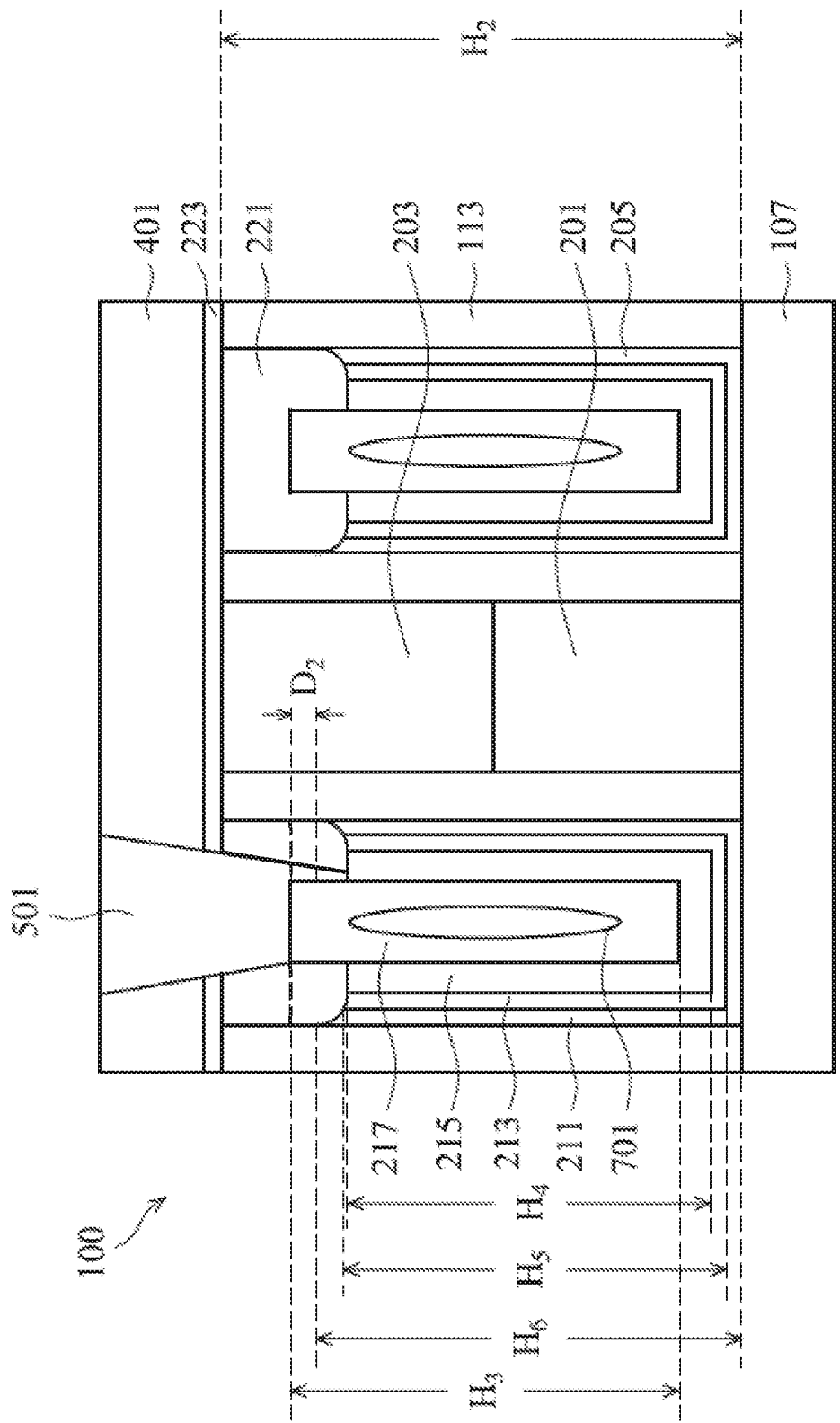
Figure 7D:
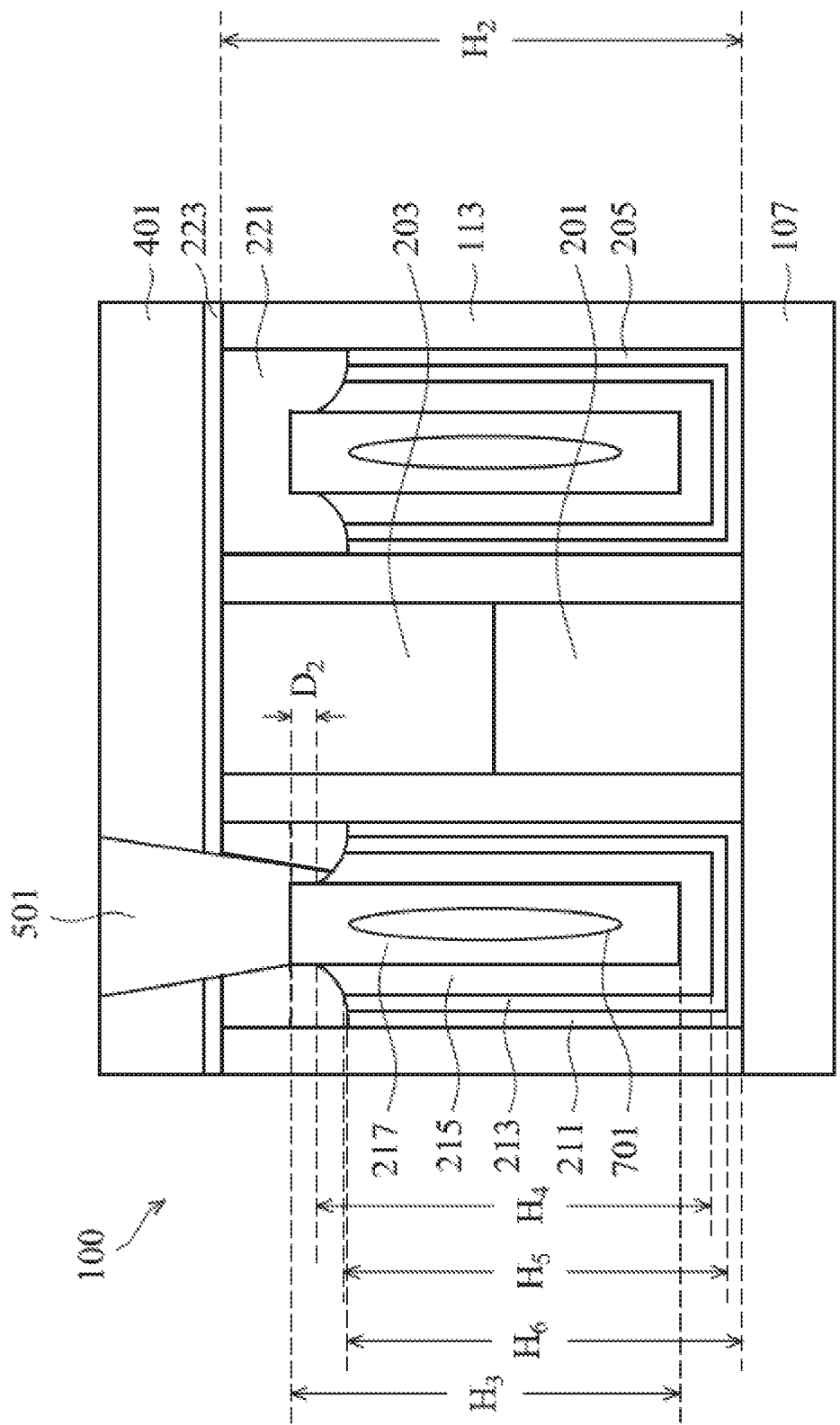

FIG. 6D illustrates yet another embodiment similar to the embodiment illustrated and discussed above with respect to FIG. 6A, but in which, instead of the second metal material 215, the first metal material 213, and the first dielectric material 211 being planar with each other, the fourth height $H_4$ of the second metal material 215 is greater than the fifth height $H_5$ of the first metal material 213, and the fifth height $H_5$ of the first metal material 213 is greater than the sixth height $H_6$ of the first dielectric material 211. However, any suitable heights may be utilized.

In this embodiment to obtain the convex shape, a series of etches may be utilized. In a particular embodiment a first etching process similar to the wet etch described above with respect to FIG. 6A may be performed in order to obtain the planar top surface of the gate stack 205. Once the wet etch has been performed, a second wet etch may be performed with etchants that are selective to the material of the first dielectric material 211, thereby recessing the material of the first dielectric material 211 at a faster rate than the material of the second metal material 215 and the first metal material 213. However, any suitable removal process or series of removal processes may be utilized.

FIGS. 7A-7D illustrate embodiments similar to those illustrated and discussed in FIGS. 6A-6D, respectively. However, in these embodiments, rather than have a seamless third metal material 217, the third metal material 217 comprises a seam 701 or void within the material of the third metal material 217. The seam 701 is formed during the deposition process for the third metal material 217 when the gate width $W_1$ is small for a short-channel device and a non-conformal deposition process is utilized. In a particular embodiment to obtain the formation of the seam, a non-conformal deposition process such as chemical vapor deposition or physical vapor deposition is utilized on a device wherein the first width $W_1$ is equal to or less than 15 nm.

FIGS. 8A-8D illustrate further embodiments in which the third metal material 217 is not extending outwards but is, rather, either even with or recessed from the second metal material 215, the first metal material 213, and the first dielectric material 211. In the embodiment illustrated in FIG. 8A, the top surface of the third metal material 217 may be closer to the fin 107 than a top surface of the second metal material 215. Additionally, the top surface of the second metal material 215 may be closer to the fin 107 than a top surface of the first metal material 213, and the top surface of the first metal material 213 may be closer to the fin 107 than a top surface of the first dielectric material 211.

In this embodiment the recessing of the gate stack 205, instead of being continued such that the third metal material 217 extends away from the second metal material 215, the first metal material 213, and the first dielectric material 211, is instead halted prior to the extension of the third metal material 217. Additionally, in embodiments in which the semiconductor device has a channel length of between about 30 nm and about 50 nm, the second metal material 215, the first metal material 213, and the first dielectric material 211 will form a slanted top surface.

FIG. 8B illustrates an embodiment similar to the embodiment described above with respect to FIG. 8B. However, in this embodiment, the third metal material 217 is recessed further from the top surface of the second metal material 215. In this embodiment the third metal material 217 may be recessed from the top surface of the second metal material 215 a third distance $D_3$ of between about 2 nm and about 10 nm. However, any suitable distances may be utilized.

In order to obtain the recessing of the third metal material 217, an additional etching process may be performed. However, in this etching process, an etchant that is selective to the material of the third metal material 217 is utilized such that the material of the third metal material 217 is removed at a faster rate than the material of the second metal material 215, the first metal material 213, or the first dielectric material 211. However, any suitable process may be utilized.

FIG. 8C illustrates another embodiment which may be similar to the embodiment described above with respect to FIG. 6C, in which the second metal material 215, the first metal material 213, and the first dielectric material 211 slope inwards. In this embodiment, however, instead of the third metal material 217 extending outwards from the second metal material 215, the third metal material 217 is even with a top surface of the second metal material 215. However, any suitable height may be utilized.

In this embodiment the recessing of the gate stack 205, instead of being continued such that the third metal material 217 extends away from the second metal material 215, the first metal material 213, and the first dielectric material 211, is instead halted prior to the extension of the third metal material 217. Additionally, in embodiments in which the semiconductor device has a channel length of between about less than about 30 nm, the second metal material 215, the first metal material 213, and the first dielectric material 211 will form the rounded top surface.

Figure 8A:
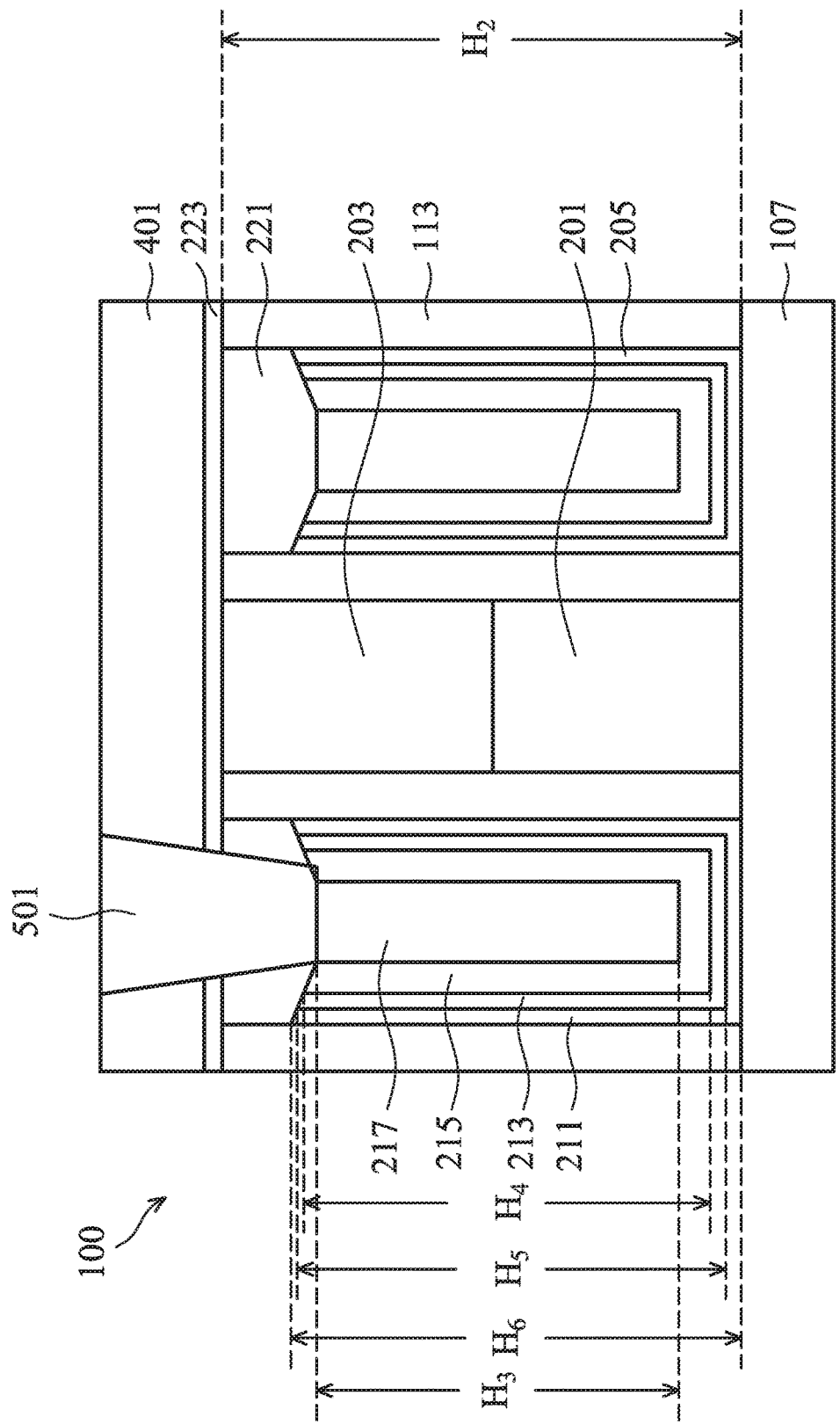
Figure 8D:
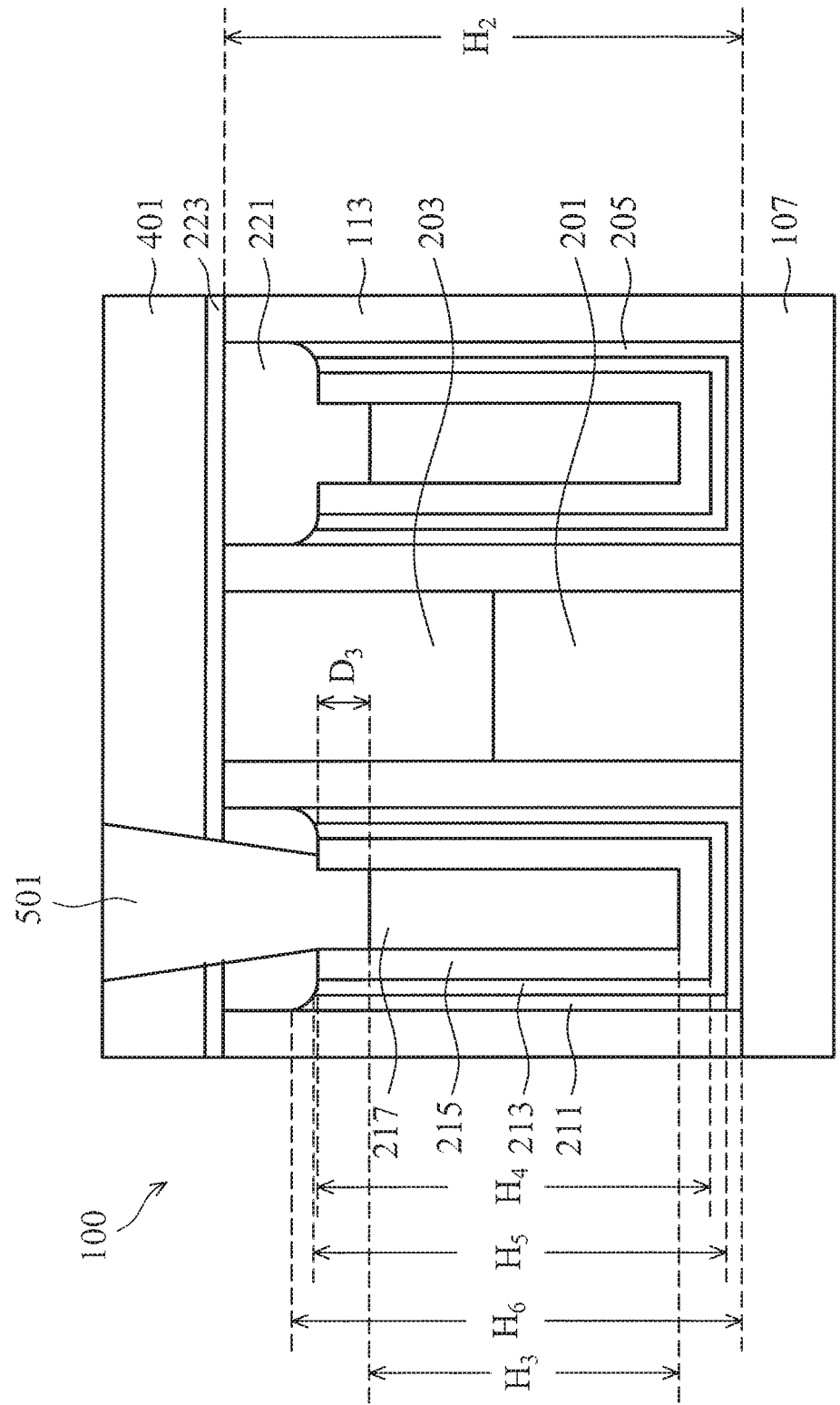
Figure 9A:
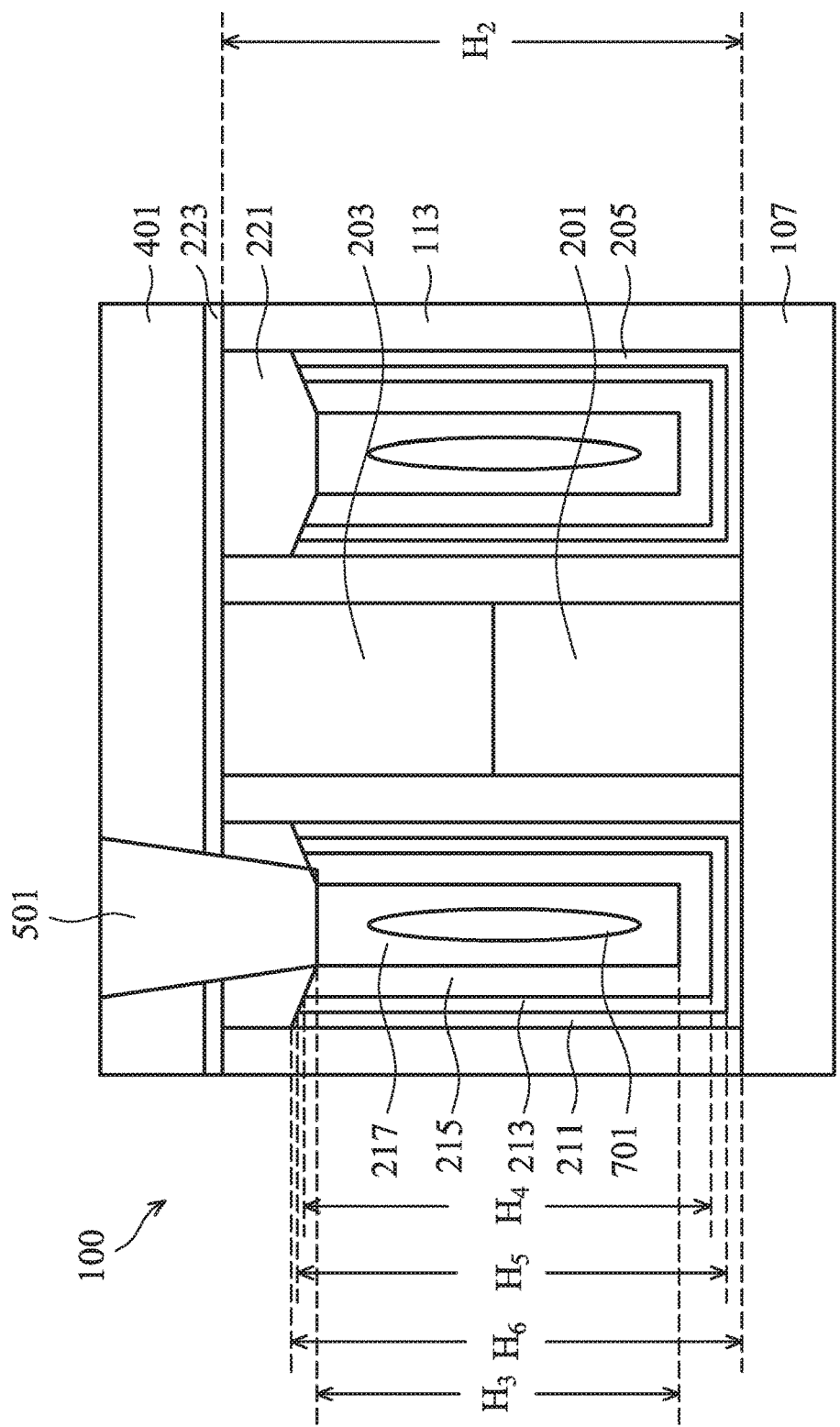
FIGS. 9A-9D illustrate a formation of a seam in accordance with some embodiments.
Figure 9B:
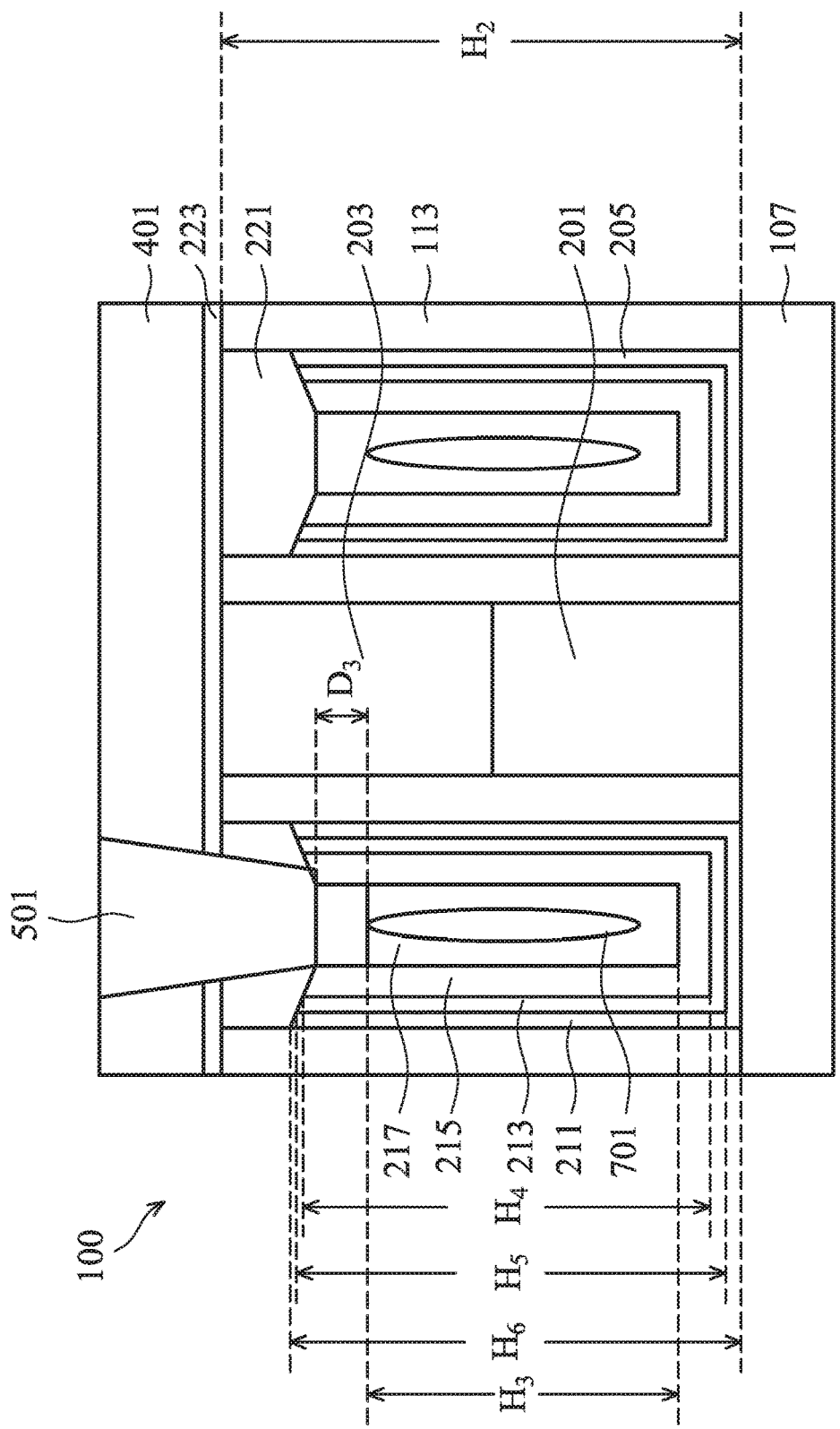
Figure 9C:
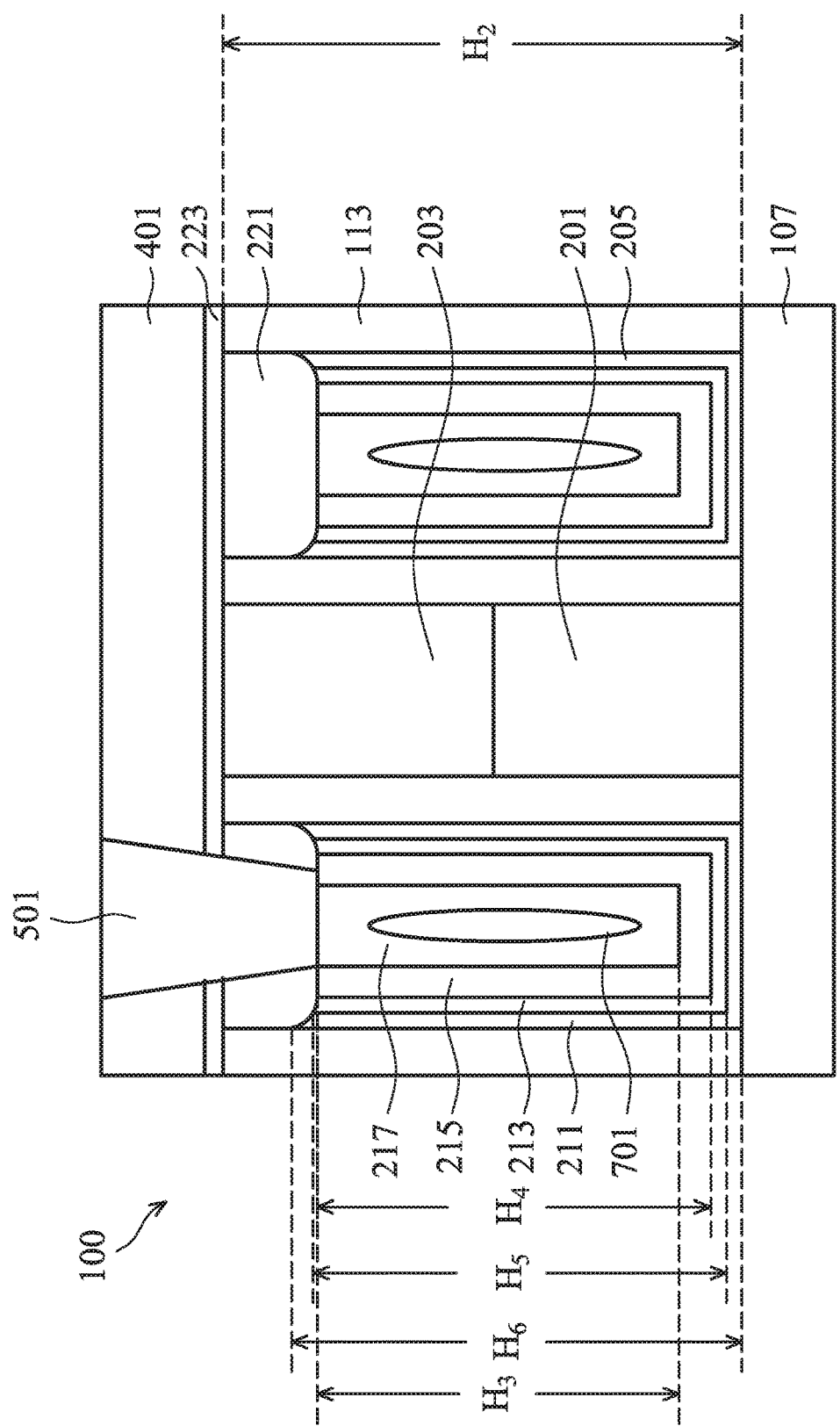
Figure 9D:
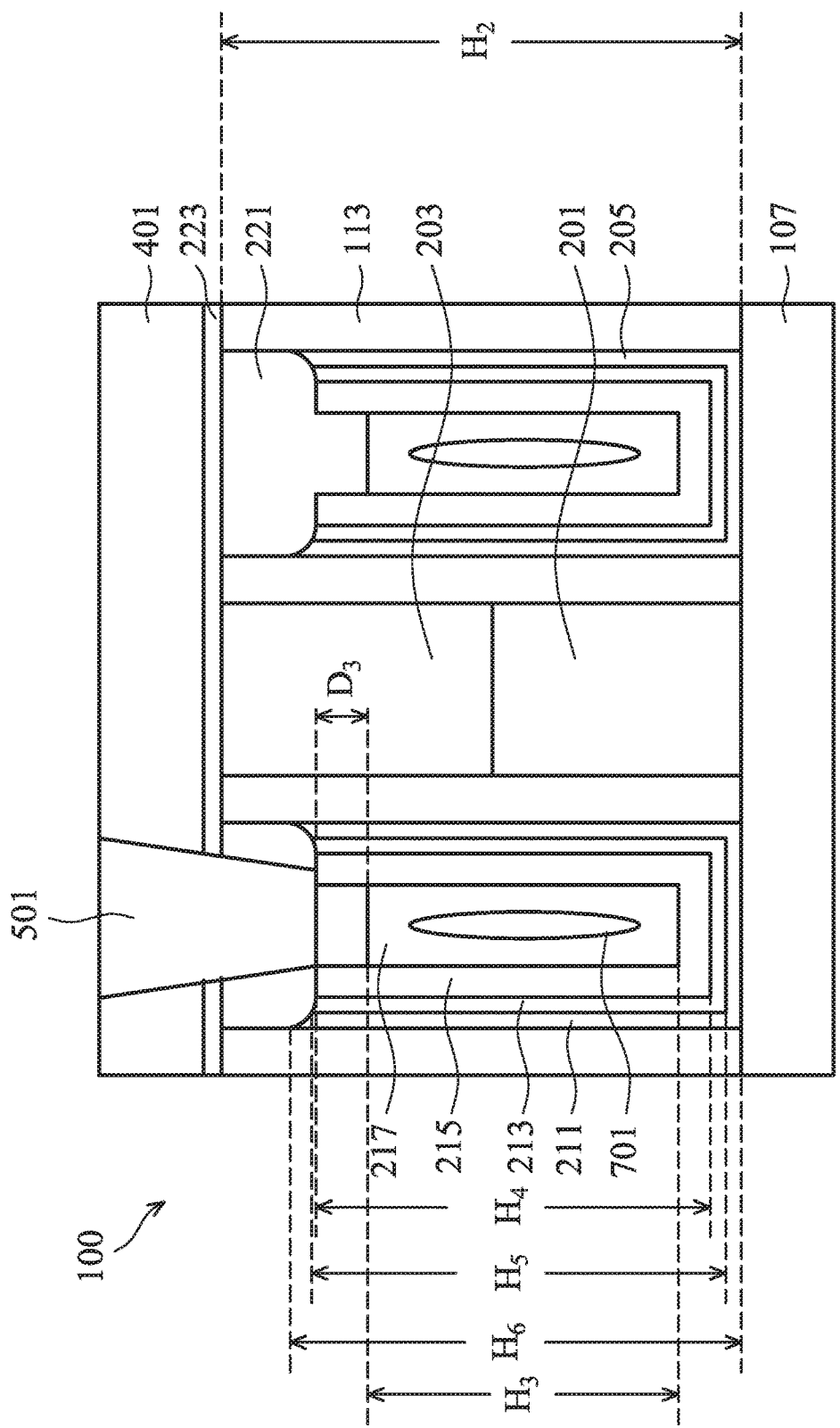

FIG. 8D illustrates another embodiment similar to the embodiment discussed above with respect to FIG. 8C in which the second metal material 215, the first metal material 213, and the first dielectric material 211 slope inwards. In this embodiment, however, instead of the third metal material 217 extending outwards from the second metal material 215, the third metal material 217 is recessed from the top surface of the second metal material 215. In this embodiment the third metal material 217 may be recessed from the top surface of the second metal material 215 the third distance $D_3$ of between about 2 nm and about 10 nm. However, any suitable distances may be utilized.

In order to obtain the recessing of the third metal material 217, an additional etching process may be performed. However, in this etching process, an etchant that is selective to the material of the third metal material 217 is utilized such that the material of the third metal material 217 is removed at a faster rate than the material of the second metal material 215, the first metal material 213, or the first dielectric material 211. However, any suitable process may be utilized.

FIGS. 9A-9D illustrate further embodiments similar to the embodiments described above with respect to FIGS. 8A-8D. In these embodiments, however, the third metal material 217 incorporates the seam 701 such as described above with respect to FIG. 7A-7D. However, any suitable method of forming the seam 701 within the third metal material 217 may be utilized.

In a representative embodiment, a semiconductor device includes a gate structure having a first width, and a conductive contact disposed over the gate structure, where the conductive contact has a bottom portion on a top surface of the gate structure, the bottom portion having a second width, and the second width is less than or about equal to the first width. The second width may be at least partially disposed within lateral extents of the first width. The second width may be fully disposed within lateral extents of the first width. A ratio of the first width to the second width may be less than about 1.1. A void is located within the gate structure. The semiconductor device may further comprise: a source/drain (S/D) region disposed adjacent the gate structure; a contact disposed over the S/D region; and a via opening extending to and exposing at least a portion of a top surface of the contact, wherein a bottommost portion of the via opening is disposed above a topmost portion of the gate structure, and the gate structure comprises a gate of a fin field-effect transistor (FinFET).

In another representative embodiment, a semiconductor device comprises: a gate having a first lateral width; a source/drain (S/D) region disposed laterally adjacent the gate; a dielectric layer disposed over the gate; a first via opening in the dielectric layer, the first via opening extending to and exposing at least a portion of a top surface of the gate, a bottom portion of the first via opening having a second lateral width, wherein a ratio of the first lateral width to the second lateral width is less than about 1.1; and a second via opening extending to and exposing at least a portion of a top surface of the contact feature, wherein a bottommost portion of the second via opening is disposed above the bottom portion of the first via opening. The gate further comprises a first dielectric material, a first metal material over the first dielectric material, a second metal material over the first metal material, the second metal material different from the first metal material, and a third metal material over the second metal material, the third metal material being different from the second metal material. The semiconductor device may further comprise: a first conductive material disposed in the first via opening, the first conductive material contacting the top surface of the gate; and a second conductive material disposed in the second via opening, the second conductive material contacting a top surface of the contact feature. The second lateral width may be at least partially disposed within lateral extents of the first lateral width. A lateral extent of the second lateral width may be disposed outside a lateral extent of the gate. The second lateral width may be fully disposed within lateral extents of the first lateral width. A ratio of the first lateral width to the second lateral width may be less than about 1.0. The gate may comprise a fin field-effect transistor (FinFET) gate.

In yet another representative embodiment, a method comprising forming a gate structure having a first lateral width is provided. A first dielectric material is deposited over the gate structure, and a first via opening is formed disposed over the gate structure and through the first dielectric material, the first via opening having a lowermost portion exposing an uppermost surface of the gate structure, the lowermost portion having a second lateral width, wherein a ratio of the second lateral width to the first lateral width is less than about 1.1. The method may further comprise: disposing a first conductive material in the first via opening, the first conductive material contacting the uppermost surface of the gate structure; and disposing a second conductive material in the second via opening, the second conductive material contacting the top surface of the contact structure. The forming the gate structure may further comprise depositing a first dielectric material, depositing a first metal material over the first dielectric material, depositing a second metal material over the first metal material, the second metal material different from the first metal material, and depositing a third metal material over the second metal material, the third metal material being different from the second metal material. The second lateral width may be disposed in a location that is at least partially within lateral extents of the first lateral width. The method may further comprise substantially aligning a first vertical centerline of the first via opening with a second vertical centerline of the gate structure. The method may further comprise providing a ratio of the first lateral width to the second lateral width that is less than about 1.0. The method may further comprise forming a fin field-effect transistor (FinFET) gate. The FinFET gate may be formed using a gate-last process or gate-first process. The FinFET may be formed using a multi-patterning process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a gate structure having a first width, wherein the gate structure comprises a first metal layer and a second metal layer over the first metal layer, wherein the first metal layer extends above the second metal layer;
   a cap layer over the gate structure, the cap layer contacting the first metal layer and the second metal layer; and
   a conductive contact disposed over the gate structure, the conductive contact having a bottom portion on a top surface of the gate structure, the bottom portion having a second width, wherein the second width is less than or about equal to the first width.

2. The semiconductor device of claim 1, further comprising a first dielectric layer interposed between the first metal layer and a spacer, wherein the first dielectric layer contacts the cap layer.

3. The semiconductor device of claim 1, wherein the conductive contact extends over an upper surface of the first metal layer.

4. The semiconductor device of claim 2, wherein the first dielectric layer extends above the first metal layer.

5. The semiconductor device of claim 2, wherein an upper surface of the first dielectric layer along an interface between the first dielectric layer and the cap layer is a curved surface.

6. The semiconductor device of claim 4, further comprising a third metal layer interposed between the first metal layer and the first dielectric layer, wherein the third metal layer extends above the first metal layer.

7. The semiconductor device of claim 5, wherein the curved surface is a concave surface.

8. A semiconductor device comprising:
   a gate dielectric;
   a gate structure over the gate dielectric, the gate structure having a first lateral width, wherein the gate structure comprises a first metal layer and a second metal layer over the first metal layer, an upper surface of the first metal layer being curved;
   a source/drain (S/D) region disposed laterally adjacent the gate structure;
   a first dielectric layer disposed over the gate structure; and a conductive contact extending through the first dielectric layer to a top surface of the gate structure, the conductive contact extending along a sidewall of the first metal layer.

9. The semiconductor device of claim 8, wherein the second metal layer is recessed from an upper surface of the first metal layer by a first distance.

10. The semiconductor device of claim 8, wherein the first dielectric layer extends along a sidewall of the first metal layer.

11. The semiconductor device of claim 8, wherein a width of the conductive contact narrows as the conductive contact approaches the gate structure.

12. The semiconductor device of claim 8, further comprising a third metal layer interposed between the second metal layer and the source/drain region, wherein upper surfaces of the third metal layer is curved.

13. The semiconductor device of claim 9, wherein the first distance is between about 2 nm and about 10 nm.

14. The semiconductor device of claim 13, wherein the third metal layer extends above the first metal layer.

15. A method comprising:
   forming a gate structure, wherein the gate structure comprises a first metal layer and a second metal layer over the first metal layer, wherein the first metal layer extends above the second metal layer;
   depositing a first dielectric material over the gate structure;
   forming a first via opening disposed over the gate structure and through the first dielectric material, the first via opening having a lowermost portion exposing an upper surface of the gate structure; and
   forming a conductive contact in the first via opening, wherein the conductive contact physically contacts the first metal layer and the second metal layer.

16. The method of claim 15, wherein forming the first via comprises exposing a sidewall of the first metal layer.

17. The method of claim 15, wherein after forming the first via opening, an upper surface of the second metal layer is level with an upper surface of the first metal layer.

18. The method of claim 15, wherein the gate structure further comprises a third metal layer, wherein the first metal layer is over the third metal layer, wherein an upper surface of the first metal layer and the third metal layer form a curved surface.

19. The method of claim 15, wherein forming the gate structure comprises recessing the second metal layer between about 2 nm and about 10 nm from an upper surface of the first metal layer.

20. The method of claim 15, further comprising forming a gate dielectric, wherein the gate dielectric extends above the first metal layer.

* * * * *